(12) United States Patent
Luch

(10) Patent No.: US 6,459,032 B1
(45) Date of Patent: *Oct. 1, 2002

(54) SUBSTRATE STRUCTURES FOR INTEGRATED SERIES CONNECTED PHOTOVOLTAIC ARRAYS AND PROCESS OF MANUFACTURE OF SUCH ARRAYS

(76) Inventor: Daniel Luch, 17161 Copper Hill Dr., Morgan Hill, CA (US) 95037

( * ) Notice: Subject to any disclaimer, the term of this patent is extended or adjusted under 35 U.S.C. 154(b) by 0 days.

This patent is subject to a terminal disclaimer.

(21) Appl. No.: 09/498,102

(22) Filed: Feb. 4, 2000

Related U.S. Application Data

(63) Continuation-in-part of application No. 08/967,962, filed on Nov. 12, 1997, now abandoned, which is a continuation of application No. 08/683,061, filed on Jul. 16, 1996, now Pat. No. 5,735,966, which is a continuation-in-part of application No. 08/441,552, filed on May 15, 1995, now Pat. No. 5,547,516.

(51) Int. Cl.[7] ............................................. H01L 25/00
(52) U.S. Cl. ...................................................... 136/244
(58) Field of Search ......................................... 136/244

(56) References Cited

U.S. PATENT DOCUMENTS

| | | |
|---|---|---|
| 3,865,699 A | 2/1975 | Luch |
| 4,038,042 A | 7/1977 | Adelman |
| 4,278,473 A | 7/1981 | Borden ........................ 136/249 |
| 4,428,110 A | 1/1984 | Kim ............................... 29/572 |
| 4,443,651 A | 4/1984 | Swartz |
| 4,517,403 A | 5/1985 | Morel et al. ................. 136/249 |
| 4,542,255 A | 9/1985 | Tanner et al. ................ 136/249 |
| 4,584,427 A | 4/1986 | Mackamul et al. .......... 136/256 |
| 4,585,490 A | 4/1986 | Raffel et al. ................. 148/1.5 |
| 4,603,470 A | 8/1986 | Yamazaki ...................... 29/572 |
| 4,624,045 A | 11/1986 | Ishihara et al. ................ 29/572 |
| 4,675,468 A | 6/1987 | Basol et al. ................... 136/256 |
| 4,697,041 A | 9/1987 | Okaniwa et al. |
| 4,724,011 A | 2/1988 | Turner et al. |
| 4,745,078 A | 5/1988 | Stetter et al. ................... 437/4 |
| 4,746,618 A | 5/1988 | Nath et al. |
| 4,758,526 A | 7/1988 | Thalheimer .................... 437/2 |
| 4,769,086 A | 9/1988 | Tanner et al. |
| 4,965,655 A | 10/1990 | Grimmer et al. |
| 5,270,229 A | 12/1993 | Ishihara ......................... 437/40 |
| 5,380,371 A | 1/1995 | Murakami .................... 136/256 |
| 5,385,848 A | 1/1995 | Grimmer |
| 5,421,908 A | 6/1995 | Yoshida et al. |
| 5,466,302 A | 11/1995 | Carey et al. .................. 136/251 |
| 5,575,861 A | 11/1996 | Younan et al. ................ 136/251 |
| 5,593,901 A | 1/1997 | Oswald et al. .................. 437/2 |
| 5,620,528 A | 4/1997 | Schade et al. ................ 136/244 |
| 5,626,686 A | 5/1997 | Yoshida |
| 5,674,325 A | 10/1997 | Albright et al. .............. 136/244 |
| 5,679,176 A | 10/1997 | Tsuzuki et al. ............... 136/251 |
| 5,733,381 A | 3/1998 | Ota et al. |
| 5,735,966 A | 4/1998 | Luch |
| 5,865,904 A | 2/1999 | Tanda ........................... 136/244 |
| 5,868,869 A | 2/1999 | Albright et al. .............. 136/250 |

Primary Examiner—Mark Chapman

(57) ABSTRACT

This invention comprises deposition of thin film photovoltaic junctions on conductive foil substrates which can be heat treated following deposition in a continuous fashion without deterioration of the metal support structure. In a separate operation, an interconnection substrate structure is produced in a continuous roll-to-roll fashion. The conductive foil supported photovoltaic junction is then laminated to the interconnection substrate structure and conductive connections are deposited to complete the module or array. In this way the interconnection substrate structure can be uniquely formulated from polymer-based materials since it does not have to endure high temperature exposure. Furthermore, the photovoltaic junction and its conductive foil support can be produced in bulk without the need to use the expensive and intricate material removal operations currently taught in the art to achieve series interconnections.

29 Claims, 37 Drawing Sheets

US 6,459,032 B1

SUBSTRATE STRUCTURES FOR INTEGRATED SERIES CONNECTED PHOTOVOLTAIC ARRAYS AND PROCESS OF MANUFACTURE OF SUCH ARRAYS

This application is a Continuation-in-Part of application Ser. No. 08/967,962 filed Nov. 12, 1997 now abandoned which is a Continuation-in-Part of application Ser. No. 08/683,061, filed Jul. 16, 1996, now U.S. Pat. No. 5,735,966 which was a Continuation-in-Part of application Ser. No. 08/441,552, filed May 15, 1995, now U.S. Pat. No. 5,547,516.

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. These thin semiconductor films are normally less than 30 micrometers thick and typically 0.05 to 5 micrometers thick. Material requirements are minimized and technologies can be proposed for mass production. The thin film structures can be designed according to doped homojunction technology such as that involving silicon films, or can employ heterojunction approaches such as those using CdTe or chalcopyrite materials.

Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. Patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. pat. Nos. 4,443,651, 4,724,011, and 4,769,086 to Swartz, Turner et al and Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

It has become well known in the art that the efficiencies of certain promising thin film photovoltaic junctions can be substantially increased by high temperature treatments. These treatments involve temperatures at which even the most heat resistant plastics suffer rapid deterioration, thereby requiring either ceramic, glass, or metal substrates to support the thin film junctions. Use of a glass or ceramic substrates generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,747,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for an inexpensive manufacturing process which allows high heat treatment for thin film photovoltaic junctions while also offering unique means to achieve effective integrated series connections.

In a somewhat removed segment of technology, a number of electrically conductive fillers have been used to produce electrically conductive polymeric materials. This technology generally involves mixing of the conductive filler into the polymer resin prior to fabrication of the material into its final shape. Conductive fillers typically consist of high aspect ratio particles such as metal fibers, metal flakes, or highly structured carbon blacks, with the choice based on a number of cost/performance considerations.

Electrically conductive resins have been used as bulk thermoplastic compositions, or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. Electrodeposits have substantially better durability than other forms of metal coatings such vacuum metallized deposits. Electrodeposited films can be quickly deposited to typical thicknesses of from 12 micrometers to 120 micrometers. In contrast, deposition via vacuum processing is much slower and thicknesses are typically 0.25 micrometers to 2.5 micrometers. Therefore, electrodeposits are much more chemically and mechanically robust than vacuum deposits and also are capable of transporting much more electrical current. ABS (acrylonitrile-butadiene-styrene) plastic dominates as the substrate of choice for most plated plastic applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction. This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. The sensitivity of ABS plastic to liquid hydrocarbons has prevented certain applications. Other applications have been thwarted by the difficulty in achieving direct selective deposition of metals onto a plastic substrate using the process. The "electroless" chemical deposition employed to achieve initial metal deposition tends to coat the entire substrate surface. One approach has been to employ two material moldings, with only one of the materials being specially formulated to be "receptive" to the chemical deposition. Despite extensive development efforts, these techniques remain expensive, difficult, and unpredictable. Another approach has been to chemically deposit the initial metal over the entire substrate and then use combined photoetching and electroplating techniques to achieve a selective metal deposit. These processes are expensive, environmentally difficult and often impractical when considering complex three dimensional substrates. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated.

Another approach proposed to simplify electroplating of plastic substrates is incorporation of electrically conductive fillers into the resin to produce an electrically conductive plastic. The electrically conductive resin is then electroplated. Most of these attempts have failed. First, achieving electrodeposit adhesion to the filled polymer substrate has been problematic. Second, the conductivity characteristic of filled resins is orders of magnitude less than typical metals. Therefore, the electrodeposit does not coat the conductive resin instantly like a metal, but rather by lateral growth of electrodeposit over the surface. In most cases, these lateral growth rates are excessively slow. In some cases, the conductive resin systems tend to form a non-conductive "skin" during processing and electrodeposition will not occur at all. Attempts to improve conductivity by increasing filler loading adversely affects costs, processability and mechanical properties. An example of this approach are the teachings of Adelman in U.S. Pat. No. 4,038,042. Adelman taught incorporation of conductive carbon black into a polymeric matrix to achieve electrical conductivity required for electroplating. The substrate was pre-etched to achieve adhesion of the subsequently electrodeposited metal. The technique suffered from excessively slow electrodeposit coverage rates.

Luch however, in U.S. Pat. No. 3,865,699 took a different approach. Luch taught incorporation of small amounts of sulfur into polymer-based compounds filled with conductive carbon black. The sulfur was shown to have two advantages. First, it participated in formation of a chemical bond between the polymer-based substrate and an initial Group VIII based metal electrodeposit. Second, the sulfur greatly increased lateral growth of the Group VIII based metal electrodeposit over the surface of the substrate, thereby avoiding a fatal problem with prior attempts to achieve direct electrodeposition on electrically conductive filled resins.

Since the polymer-based compositions taught by Luch could be electroplated directly without any pretreatments, they could be accurately defined as directly electroplateable resins (DER). Directly electroplateable resins, (DER), are characterized by the following features.

(a) having a polymer matrix;

(b) presence of carbon black in amounts sufficient for the overall composition to have an electrical volume resistivity of less than 1000 ohm-cm., e.g., 100 ohm-cm., 10 ohm-cm., 1 ohm-cm.;

(c) presence of sulfur (including any sulfur provided by sulfur donors) in amounts greater than about 0.1% by weight of the overall polymer-carbon-sulfur composition; and (d) presence of the polymer, carbon and sulfur in said directly electroplateable composition of matter in cooperative amounts required to achieve direct, uniform, rapid and adherent coverage of said composition of matter with an electrodeposited Group VIII metal or Group VIII metal-based alloy.

The minimum workable level of carbon black required to achieve electrical resistivities less than 1000 ohm-cm. appears to be about 8 weight percent based on the weight of polymer plus carbon black.

There are a number of polymers suitable for the DER matrix. These include but are not limited to polyvinyls, polyolefins, polystyrenes, elastomers, polyamides, and polyesters, the choice generally being dictated by the physical properties required.

In order to eliminate ambiguity in terminology of the present specification and claims, the following definitions are supplied.

"Metal-based" refers to a material having metallic properties comprising one or more elements, at least one of which is an elemental metal.

"Metal-based alloy" refers to a substance having metallic properties and being composed of two or more elements of which at least one is an elemental metal.

"Polymer-based" refers to a substance composed, by volume, of 50 percent or more hydrocarbon polymer.

"Group VIII-based" refers to a metal (including alloys) containing, by weight, 50% to 100% metal from Group VIII of the Periodic Table of Elements.

It is important to note that electrical conductivity alone is insufficient to permit a plastic substrate to be directly electroplated. The plastic surface must be electrically conductive on a microscopic scale. For example, simply loading a small volume percentage of metal fibers may impart conductivity on a scale suitable for electromagnetic radiation shielding, but the fiber separation would likely prevent uniform direct electroplating. In addition, many conductive thermoplastic materials form a non-conductive surface skin during fabrication, effectively eliminating the surface conductivity required for direct electroplating.

OBJECTS OF THE INVENTION

An object of the invention is to eliminate the deficiencies in the prior art methods of producing expansive area, series interconnected photovoltaic arrays. A further object of the present invention is to provide improved substrates to achieve series interconnections among expansive thin film cells. A further object of the invention is to permit inexpensive production of high efficiency, heat treated thin film photovoltaic cells while simultaneously permitting the use of polymer based substrate materials and associated processing to effectively interconnect those cells. A further object of the present invention is to provide improved processes whereby expansive area, series interconnected photovoltaic arrays can be economically mass produced.

Other objects and advantages will become apparent in light of the following description taken in conjunction with the drawings and embodiments.

SUMMARY OF THE INVENTION

The current invention provides a solution to the stated need by producing the active photovoltaic film and interconnecting substrate separately and subsequently combining them to produce the desired expansive series interconnected array or module. The invention contemplates deposition of thin film photovoltaic junctions on metal foil substrates which can be heat treated following deposition in a continuous fashion without deterioration of the metal support structure. In a separate operation, an interconnection substrate structure is produced in a continuous roll-to-roll fashion. The metal foil supported photovoltaic junction is then laminated to the interconnecting substrate structure and conductive connections are deposited to complete the array or module. In this way the interconnection substrate structure can be uniquely formulated from polymer-based materials since it does not have to endure high temperature exposure. Furthermore, the photovoltaic junction and its metal foil support can be produced in bulk without the need to use the expensive and intricate material removal operations currently taught in the art to achieve series interconnections. Finally, the process of the current invention is substantially fully additive, eliminating the wasteful and difficult scribing and material removal aspects of prior art teachings.

BRIEF DESCRIPTION OF THE DRAWINGS

The various factors and details of the structures and manufacturing methods of the present invention are hereinafter more fully set forth with reference to the accompanying drawings wherein:

FIG. 13A is a side view of the process. FIG. 13B is a sectional view taken substantially along line 13b—13b of FIG. 13A.

DESCRIPTION OF PREFERRED EMBODIMENTS

Figure 1:
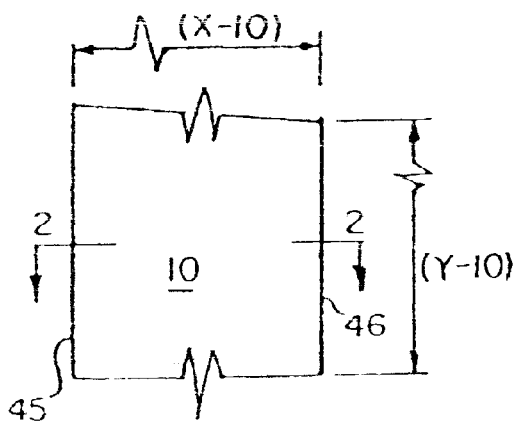
FIG. 1 is a top plan view of a thin film photovoltaic cell including its support foil.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
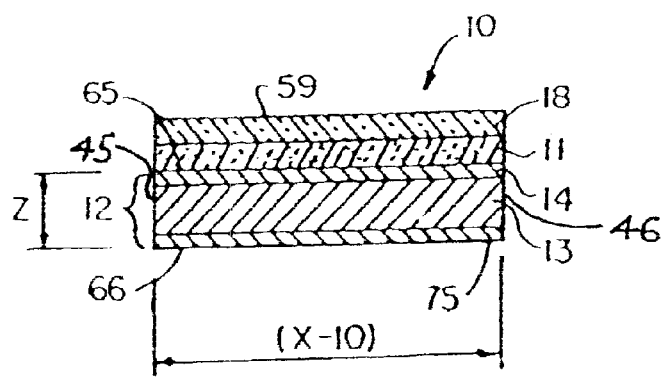
FIG. 2 is a sectional view taken substantially along the line 2—2 of FIG. 1.

Referring to FIGS. 1 and 2, a thin film photovoltaic cell, including a supporting conductive foil is generally indicated by 10. Cell 10 has a top surface 59 and comprises a thin film photovoltaic structure 11 supported by conductive foil 12.

Foil 12 has a width X-10, length Y-10 and thickness Z-10. The full extent of width X-10 of foil 12 defines a first photovoltaic cell terminal edge 45 and second photovoltaic cell terminal edge 46. It is contemplated that length Y-10 is considerably greater than width X-10 and length Y-10 can generally be described as "continuous" or being able to be processed in a roll-to-roll fashion. Foil 12 has first surface 65 and second surface 66. Typically foil 12 will be metal-based. A metal-based foil 12 may be of uniform composition or may comprise a laminate of two or more metal-based layers. For example, foil 12 may comprise a base layer of inexpensive and processable metal 13 with an additional metal-based layer 14 disposed between base layer 13 and photovoltaic structure 11. The additional metal-based layer may be chosen to ensure good ohmic contact between the top surface 65 of support 12 and photovoltaic structure 11. Bottom surface 66 of foil support 12 may comprise a material 75 chosen to achieve good electrical and mechanical joining characteristics to the substrate as will be shown. The thickness Z of support layer 12 is generally contemplated to be between 0.001 cm. and 0.025 cm. This thickness would provide adequate handling strength while still allowing flexibility for roll-to-roll processing. Those skilled in the art will understand that cell 10 is substantially devoid of holes extending from top surface 59 to bottom surface 66 which would result in discontinuities in photovoltaic structure 11 and could adversely affect cell performance through electrical shorting.

Figure 3:
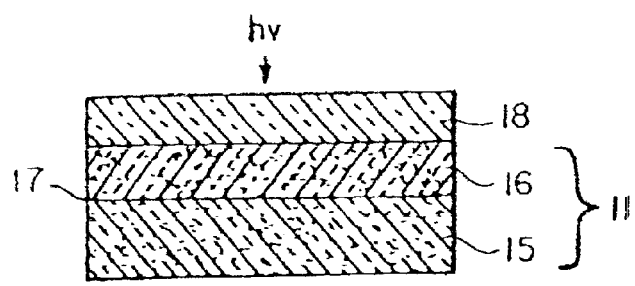
FIG. 3 is an expanded sectional view showing a form of the structure of layer 11 of FIG. 2.

Photovoltaic structure 11 can be any of the thin film structures known in the art. In its simplest form, the photovoltaic cell combines an n-type semiconductor with a p-type semiconductor to form an n-p junction. FIG. 3 illustrates an example of a typical photovoltaic cell structure in section. In FIG. 3 and many subsequent figures the arrow labeled "hv" is used to indicate the light incident side of the structure. In FIG. 3, 15 represents a thin film of a p-type semiconductor, 16 a thin film of n-type semiconductor and 17 the resulting photovoltaic junction. The exact nature of the photovoltaic structure 11 does not form the subject matter of the present invention. Most often an optically transparent window electrode 18 such as a thin film of zinc or tin oxide is positioned over photovoltaic structure 11 to minimize resistive losses involved in current collection. Photovoltaic structure 11 and window electrode 18 cover substantially the entire top surface 65 of foil support 12.

Figure 4:
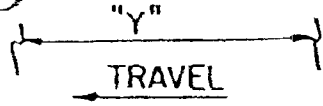
FIG. 4 illustrates a process for producing the structure shown in FIGS. 1 through 3.
Figure 4:
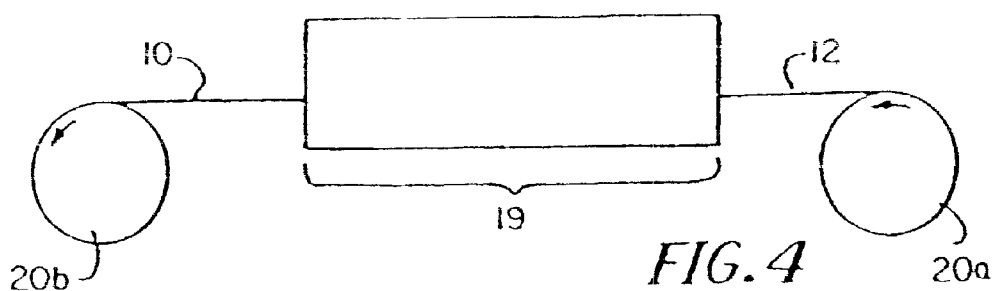

FIG. 4 refers to the method of manufacture of the foil supported photovoltaic structures generally illustrated in FIGS. 1 through 3. The metal-based support foil 12 is moved in the direction of its length Y through a deposition process, generally indicated as 19. Process 19 accomplishes deposition of the active photovoltaic structure onto support foil 12. Support foil 12 is unwound from supply roll 20a, passed through deposition process 19 and rewound onto takeup roll 20b. Process 19 can comprise any of the processes well-known in the art for depositing thin film photovoltaic structures. These processes include electroplating, vacuum sputtering, and chemical deposition. Process 19 may also include treatments, such as heat treatments, intended to enhance photovoltaic cell performance.

Figure 5:
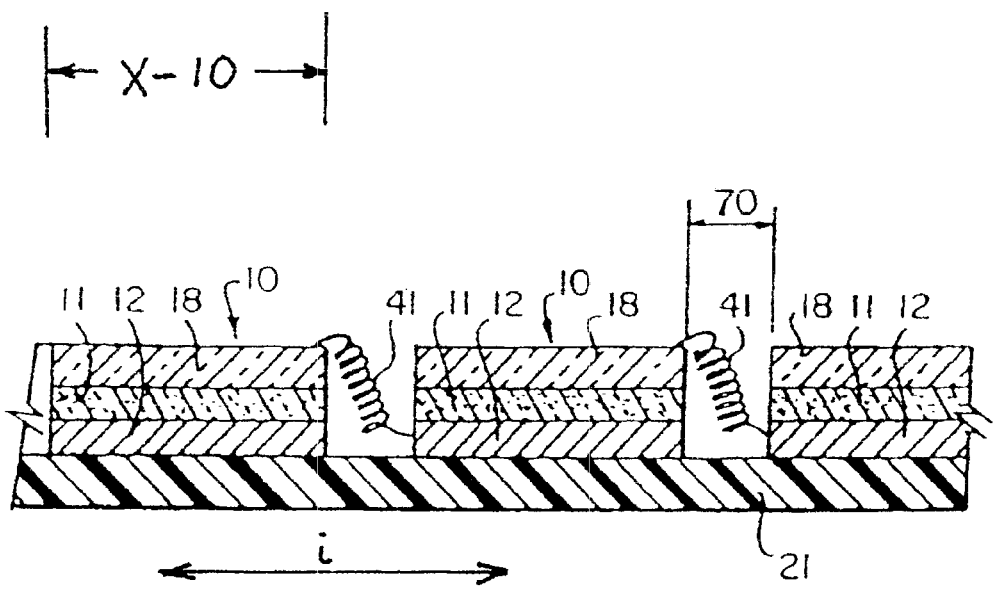
FIG. 5 is a sectional view illustrating the problems associated with making series connections among thin film photovoltaic cells shown in FIGS. 1–3.

Referring now to FIG. 5, there are illustrated cells 10 as shown in FIG. 2. The cells have been positioned to achieve spacial positioning on the support substrate 21. Support structure 21 is by necessity non-conductive at least in that distance indicated by numeral 70 separating the adjacent cells 10. This insulating space prevents short circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication results in a net current flow in the direction of the arrow identified as "i" in FIG. 5. This net current flow direction is substantially parallel to width X-10 of foil 12 of photovoltaic cell 10. Electrical communication from top surface of window electrode 18 to the foil electrode 12 of an adjacent cell is shown in FIG. 5 as a metal wire 41. Metal wire 41 is clearly impractical for inexpensive continuous production and is shown for illustration purposes only. It should be noted that foil electrode 12 is relatively thin, on the order of 0.001 cm to 0.025 cm. Therefore connecting to its edge as indicated in FIG. 5 would be impractical.

Figure 6:
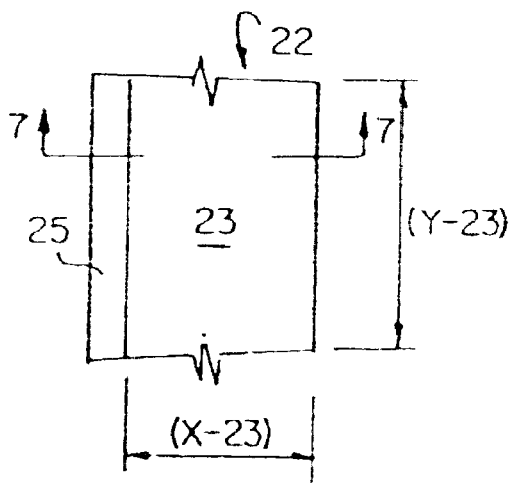
FIG. 6 is a top plan view of a substrate structure for achieving series interconnections of thin film photovoltaic cells.
Figure 7:
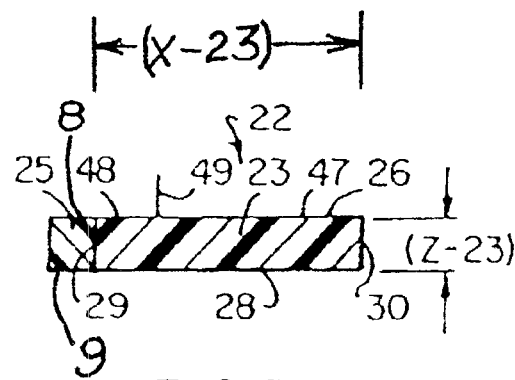
FIG. 7 is a sectional view taken substantially along the line 7—7 of FIG. 6.

Referring now to FIGS. 6 and 7, one embodiment of the interconnecting and supporting substrate structures of the current invention is generally indicated by 22. Unit of substrate 22 comprises electrically conductive resin sheet 23 and electrically insulating joining portion region 25. Region 25 has non-conductive top and bottom surfaces 8 and 9 respectively. Electrically conductive region 23 has a top, light incident side top conductive surface 26 extending between a first terminal edge 29 and a second terminal edge 30 of conductive surface 26. Width X-23 defines first and second terminal edges 29 and 30 respectively. Electrically conductive region 23 also has a bottom surface 28, length Y-23 and thickness Z-23. Top surface 26 of conductive sheet 23 can be thought of as having top collector surface 47 and top contact surface 48 separated by imaginary insulating boundary 49. The purpose for these definitions will become clear in the following.

Figure 7A:
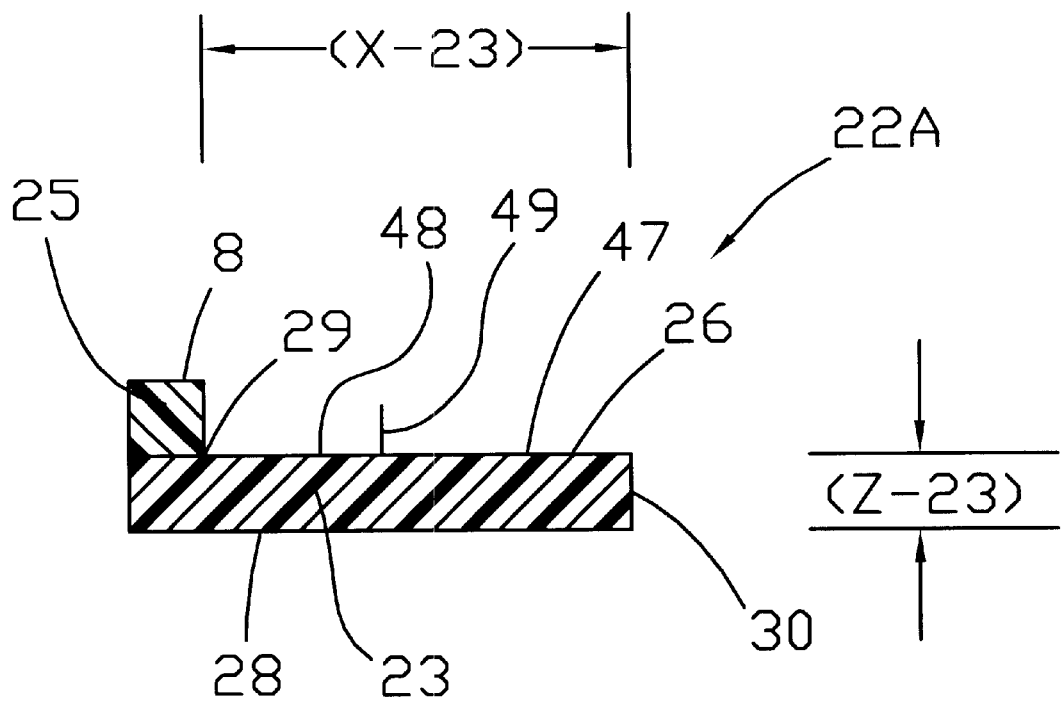
FIG. 7A is a sectional view similar to FIG. 7 of an alternate embodiment.

An alternate embodiment of unit of substrate, indicated as 23a, is illustrated in FIG. 7A. In the FIG. 7A embodiment, the electrically insulating joining portion 25 is positioned to overlay a portion of electrically conductive sheet 23. In this case, width dimension X-23 extending between terminal edges 29 and 30 of the conductive top surface 26 is less than the full width of electrically conductive sheet 23.

Figure 7B:
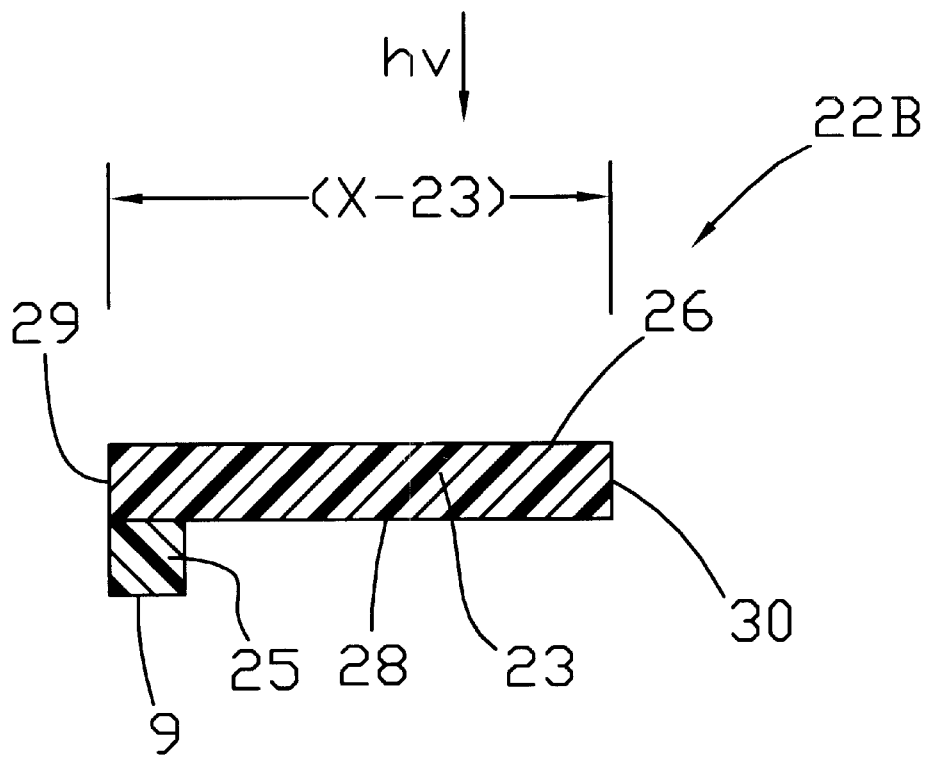
FIG. 7B is a sectional view similar to FIGS. 7 and 7A of an additional embodiment of a substrate structure.

A further embodiment of unit of substrate, indicated as 22b, is illustrated in FIG. 7B. In the FIG. 7B embodiment, the electrically insulating joining portion 25 is positioned on the lower surface 28 of electrically conductive sheet 23.

Electrically conductive sheet 23 includes an electrically conductive polymer. Typically, electrically conductive polymers exhibit bulk resistivity values of less than 1000 ohm-cm. Resistivities less than 1000 ohm-cm can be readily achieved by compounding well-known conductive fillers into a polymer matrix binder.

Figure 8:
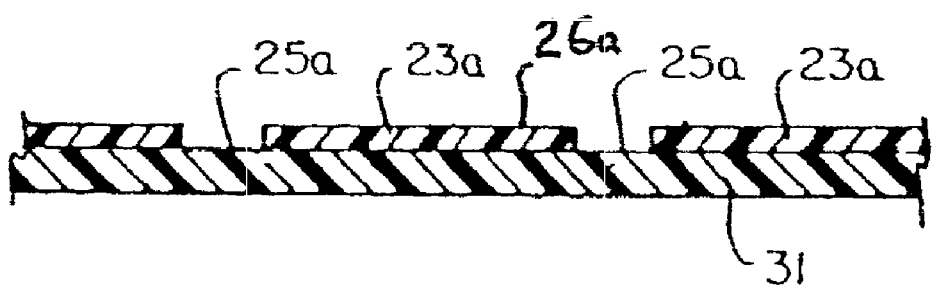
FIG. 8 is a sectional view similar to FIG. 7 showing an alternate embodiment of a substrate structure for achieving series interconnections of thin film photovoltaic cells.

The substrate unit 22 may be fabricated in a number of different ways. Electrically conductive sheet 23 can comprise an extruded film of electrically conductive polymer joined to a strip of compatible insulating polymer 25 at or near terminal edge 29 as illustrated in FIG. 7. Alternatively, the conductive sheet may comprise a strip of electrically conductive polymer 23a laminated to an insulating support structure 31 as illustrated in section in FIG. 8. In FIG. 8, electrically insulating joining portions 25a are simply those portions of insulating support structure 31 not overlaid by sheets 23a.

It is contemplated that electrically conductive sheets 23 may comprise materials in addition to the electrically conductive polymer. For example, a metal may be electrodeposited to the electrically conductive polymer for increased conductivity. In this regard, the use of a directly electroplateable resin (DER) may be particularly advantageous. DER's cover with metal rapidly by lateral growth of electrodeposit. In addition, selective metal coverage of a multi material structure is readily achieved when one of the materials is DER. For example, were region 23 shown in FIG. 7 to comprise a DER, exposing the FIG. 7 structure to a Group VIII electroplating bath would result in rapid metal electrodeposition of region 23 only while region 25 would remain unplated. The fact that DER's are readily fabricated either as bulk compositions or coatings qualifies DER's as being eminently suitable in this application.

Figure 9:
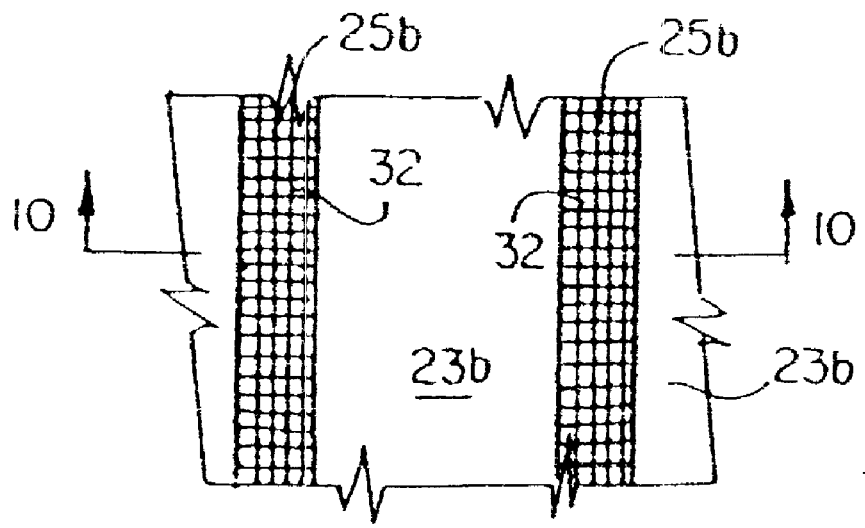
FIG. 9 is a top plan view of an alternate embodiment of a substrate structure for achieving series interconnections of thin film photovoltaic cells.
Figure 10:
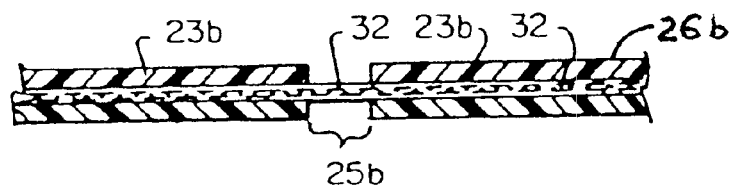
FIG. 10 is a sectional view similar to FIGS. 7 and 8 taken substantially along line 10—10 of FIG. 9.

A further embodiment of fabrication of substrate unit 22 is illustrated in FIGS. 9 and 10. In FIG. 9, electrically conductive sheet 23b comprises electrically conductive polymer impregnated into a fabric or web 32. A number of known techniques can be used to achieve such impregnation. Insulating joining portion 25b in FIG. 9 is simply an un-impregnated extension of the web 32. Fabric or web 32 can be selected from a number of woven or non-woven fabrics, including non-polymeric materials such as fiberglass.

Figure 11:
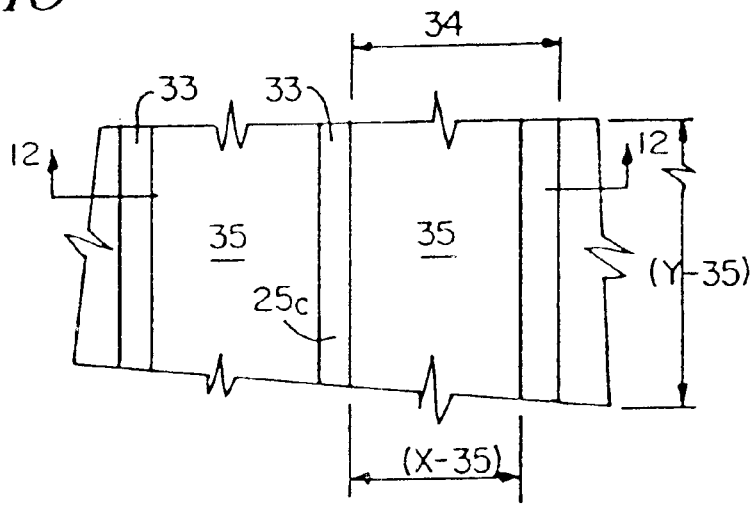
FIG. 11 is a top plan view of another embodiment of a substrate structure for achieving series interconnections of thin film photovoltaic cells.

Referring now to FIG. 11, an alternate embodiment for the substrate structures of the present invention is illustrated. In the FIG. 11, a support web or film 33 extends among and supports multiple individual cell units, generally designated by repeat structure 34. Electrically conductive sheets 35 are analogous to sheet 23 of FIGS. 6 through 10. At the stage of overall manufacture illustrated in FIG. 11, electrically conductive sheets 35 need not comprise an electrically conductive polymer as do sheets 23 of FIGS. 6 through 10. However, as will be shown, electrically conducting means, typically in the form of an electrically conductive polymer containing adhesive, must eventually be utilized to join photovoltaic laminate 10 to the top surface 50 of electrically conductive sheets 35. In addition, the electrically conducting sheets 35 must be attached to the support carrier 33 with integrity required to maintain positioning and dimensional control. This is normally accomplished with an adhesive, indicated by layer 36 of FIG. 12.

Figure 12:
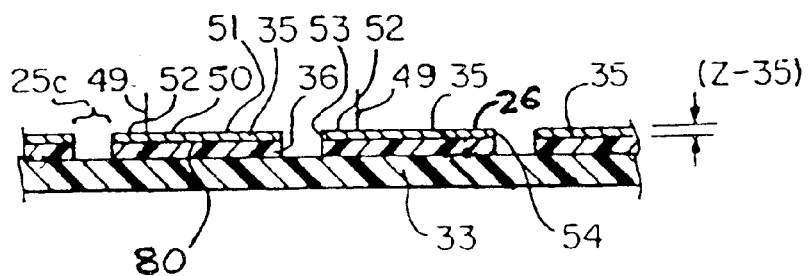
FIG. 12 is a sectional view taken substantially along the line 12—12 of FIG. 11.

Conductive sheets 35 are shown in FIGS. 11 and 12 as having length Y-35, width X-35 and thickness Z-35. It is contemplated that length Y-35 is considerably greater than width X-35 and length Y-35 can generally be described as "continuous" or being able to be processed in roll-to-roll fashion. Width X-35 defines a first terminal edge 53 and second terminal edge 54 of sheet 35.

It is important to note that the thickness of the conductive sheets 35, Z-35 must be sufficient to allow for continuous lamination to the support web 33. Typically when using metal based foils for sheets 35, thickness between 0.001 cm and 0.025 cm would be chosen.

As with the substrate structures of FIGS. 6 through 10, it is helpful to characterize top surface 50 of conductive sheets 35 as having a top collector surface 51 and a top contact surface 52 separated by an imaginary barrier 49. Conductive sheet 35 also is characterized as having a bottom surface 80.

It is readily realized that the photovoltaic cells 10 of FIGS. 1–3 are separately prepared and are initially separate and distinct from the substrate support structures taught in FIGS. 6–12. This initial separation permits elevated temperature processing of cells 10 while permitting design of unique polymer containing interconnect substrate structures. The polymer containing substrates can be made flexible and be processed in continuous roll to roll fashion.

Figure 13A:
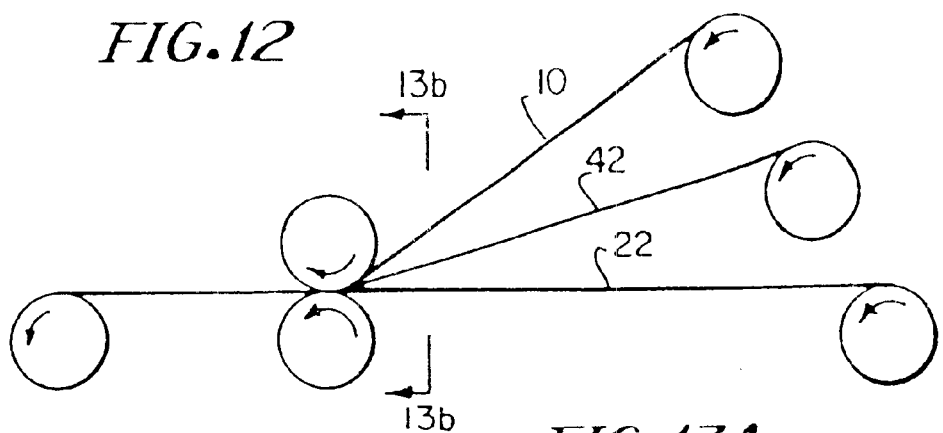
FIGS. 13A and 13B schematically depict a process for laminating the foil supported thin film photovoltaic structure of FIGS. 1 through 3 to an interconnecting substrate structure.
Figure 13B:
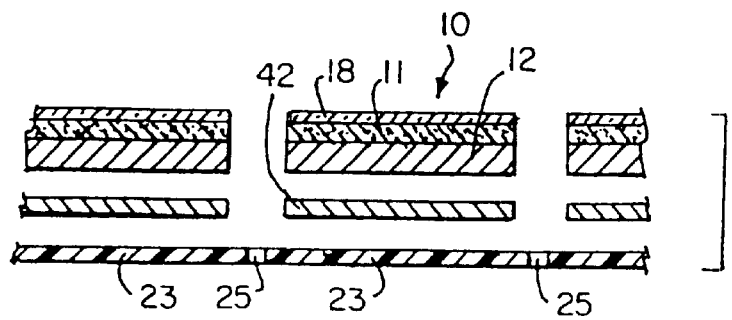

Referring now to FIGS. 13A and 13B, a process is shown for laminating the metal-based foil supported thin film photovoltaic structure of FIGS. 1 through 3 to the substrate structures taught in FIGS. 6 through 12. In FIGS. 13A and 13B, photovoltaic cell structures as illustrated in FIGS. 1 through 3 are indicated by numeral 10. Substrate structures as taught in the FIGS. 6 through 12 are indicated by the numeral 22. Numeral 42 indicates a film of electrically conductive adhesive intended to join electrically conductive metal-based foil 12 of FIGS. 1 through 3 to electrically conductive sheet 23 of FIGS. 6 through 10 or electrically conductive sheets 35 of FIGS. 11 and 12. It will be appreciated by those skilled in the art that the adhesive strip 42 shown in FIGS. 13A and 13B is one of but a number of appropriate metal joining techniques which would maintain required ohmic communication. For example, it is contemplated that methods such as doctor blading a conductive resin prior to lamination, spot welding, soldering, joining with low melt temperature alloys, or crimped mechanical contacts would serve as equivalent methods to accomplish the ohmic joining illustrated as achieved in FIGS. 13A and 13B with a strip of conductive adhesive. These equivalent methods can be generically referred to as conductive joining means. In FIG. 13B, the process of FIG. 13A is illustrated using the substrate of FIGS. 6 and 7.

Figure 14A:
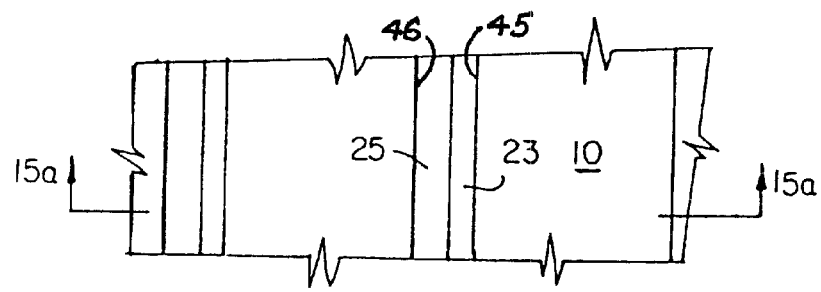
FIGS. 14A, 14B, and 14C are views of the structures resulting from the laminating process of FIG. 13 and using the substrate structure of FIGS. 7, 8 and 10 respectively.
Figure 14B:
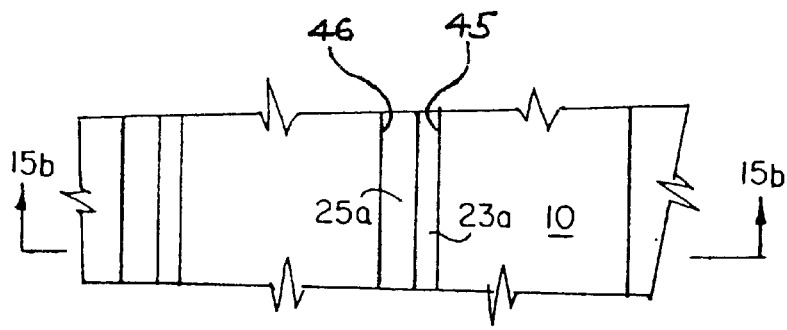
Figure 14C:
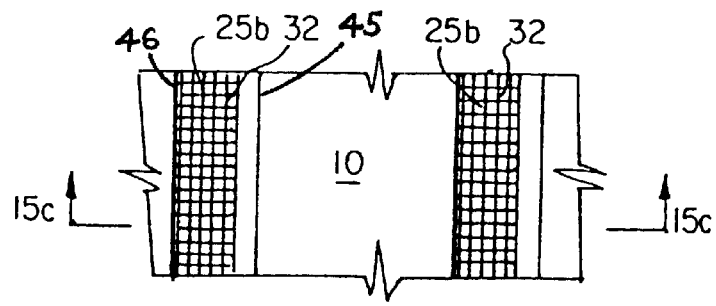

Referring now to FIGS. 14 and 15, there is shown the result of the lamination process of FIGS. 13A and 13B using the substrate structure of FIGS. 6 through 10. FIGS. 14A and 15A correspond to the substrate structures of FIGS. 6 and 7. FIGS. 14B and 15B correspond to the substrate structure of FIG. 8. FIGS. 14C and 15C correspond to the substrate structures of FIGS. 9 and 10. FIG. 15D corresponds to the substrate structure of FIG. 7A. FIGS. 15E and 15F correspond to the substrate structure of FIG. 7B.

FIGS. 14A through 14C show that the cells 10 have been positioned with first terminal edge 45 of one cell being substantially parallel to second terminal edge 46 of an adjacent cell.

Figure 15A:
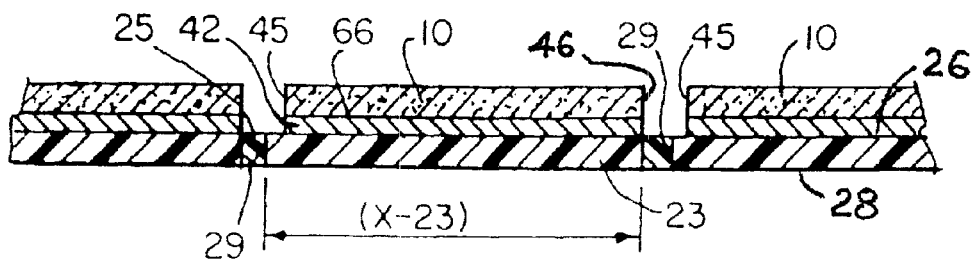
FIGS. 15A, 15B, and 15C are sectional views taken substantially along the lines 15a—15a, 15b—15b, and 15c—15c of FIGS. 14A, 14B, and 14C respectively.
Figure 15B:
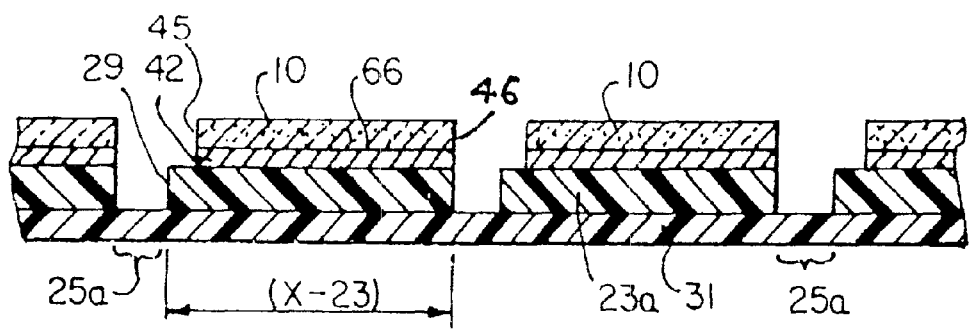
Figure 15C:
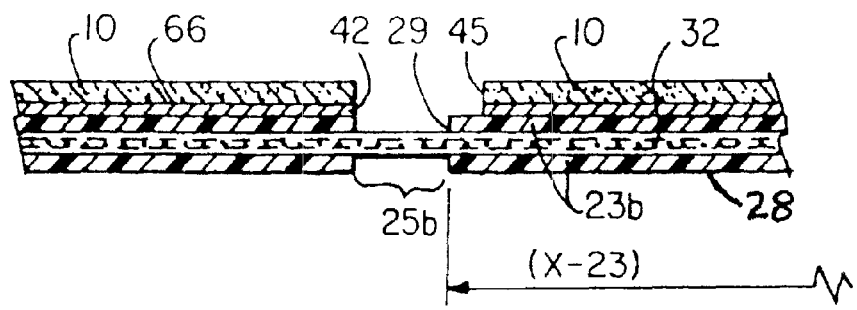
Figure 22:
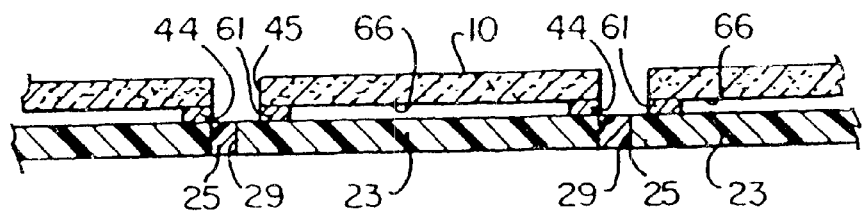
FIG. 22 is a sectional view similar to FIG. 15A but showing an alternate method of accomplishing the mechanical and electrical joining of the lamination process of FIG. 13.

In the FIGS. 15A, 15B and 15C, electrically conductive adhesive layer 42 is shown as extending completely and contacting the entirety of the second surface 66 of metal-based foil supported photovoltaic cells 10. This complete surface coverage is not a requirement however, in that foil 12 is highly conductive and able to distribute current over the expansive width X-10 with minimal resistance losses. For example, the structure of FIG. 22 shows an embodiment wherein electrical communication is achieved between conductive sheet 23 of FIGS. 6 and 7 and second surface 66 of foil 12 through a narrow bead of conductive joining means 61. An additional bead of adhesive shown in FIG. 22 by 44, may be used to ensure spacial positioning and dimensional support for this form of structure. Adhesive 44 need not be electrically conductive.

Figure 15D:
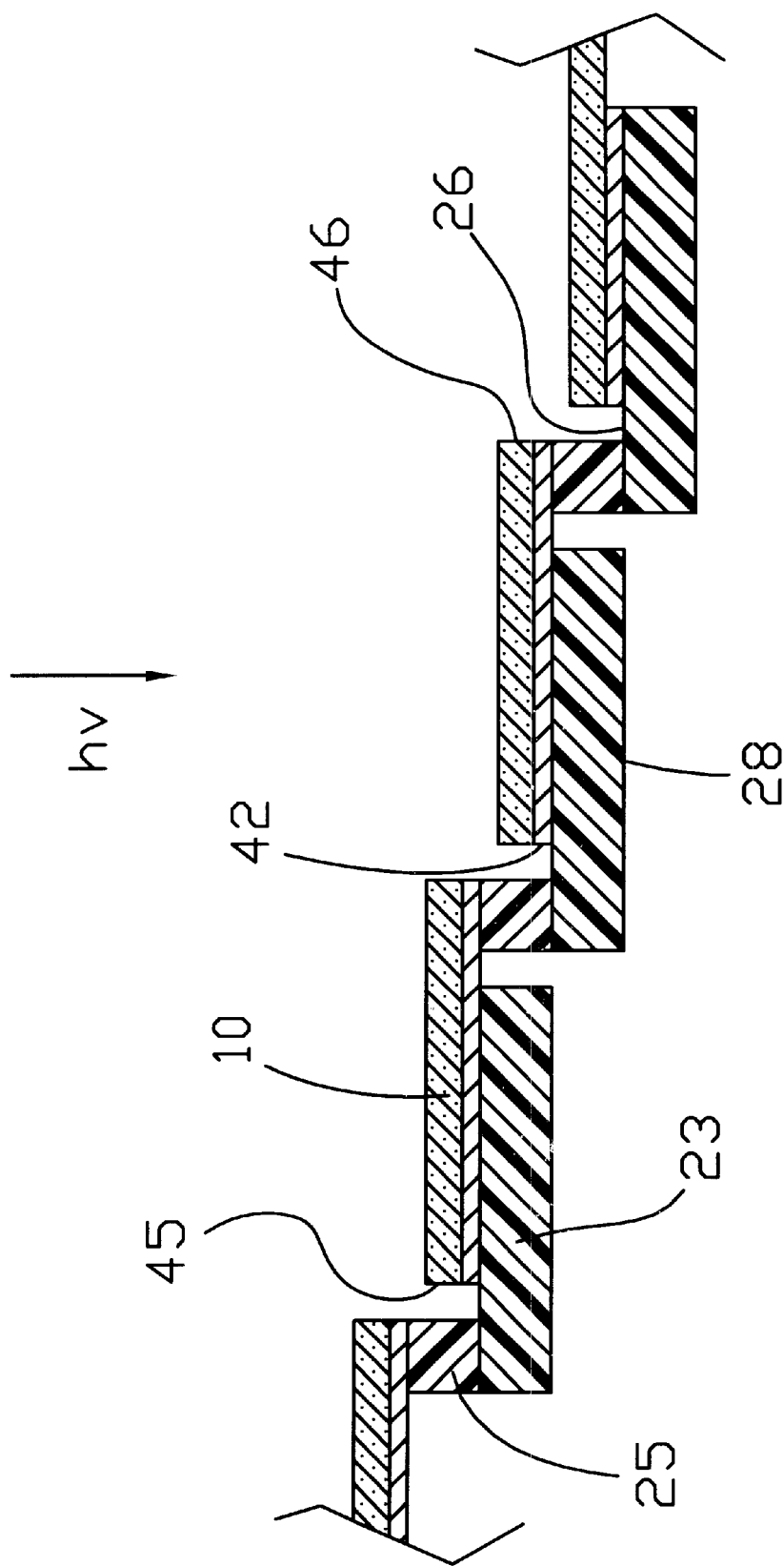
FIGS. 15D, 15E, and 15F are sectional views similar to FIGS. 15A–15C illustrating additional embodiments of structures resulting from the laminating process of FIGS. 13A and 13B employing the substrate structures of FIGS. 7A and 7B.
Figure 15E:
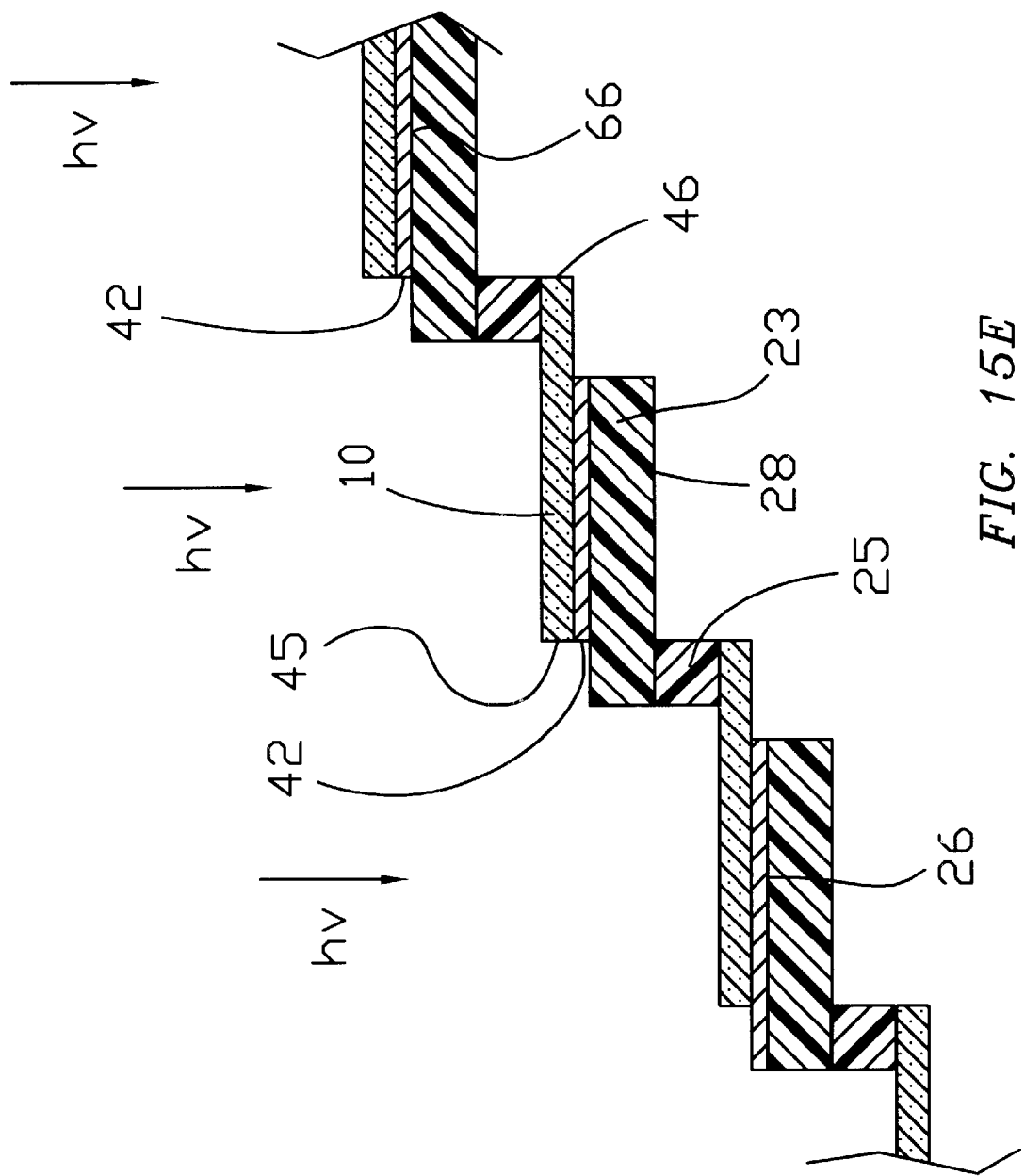
Figure 15F:
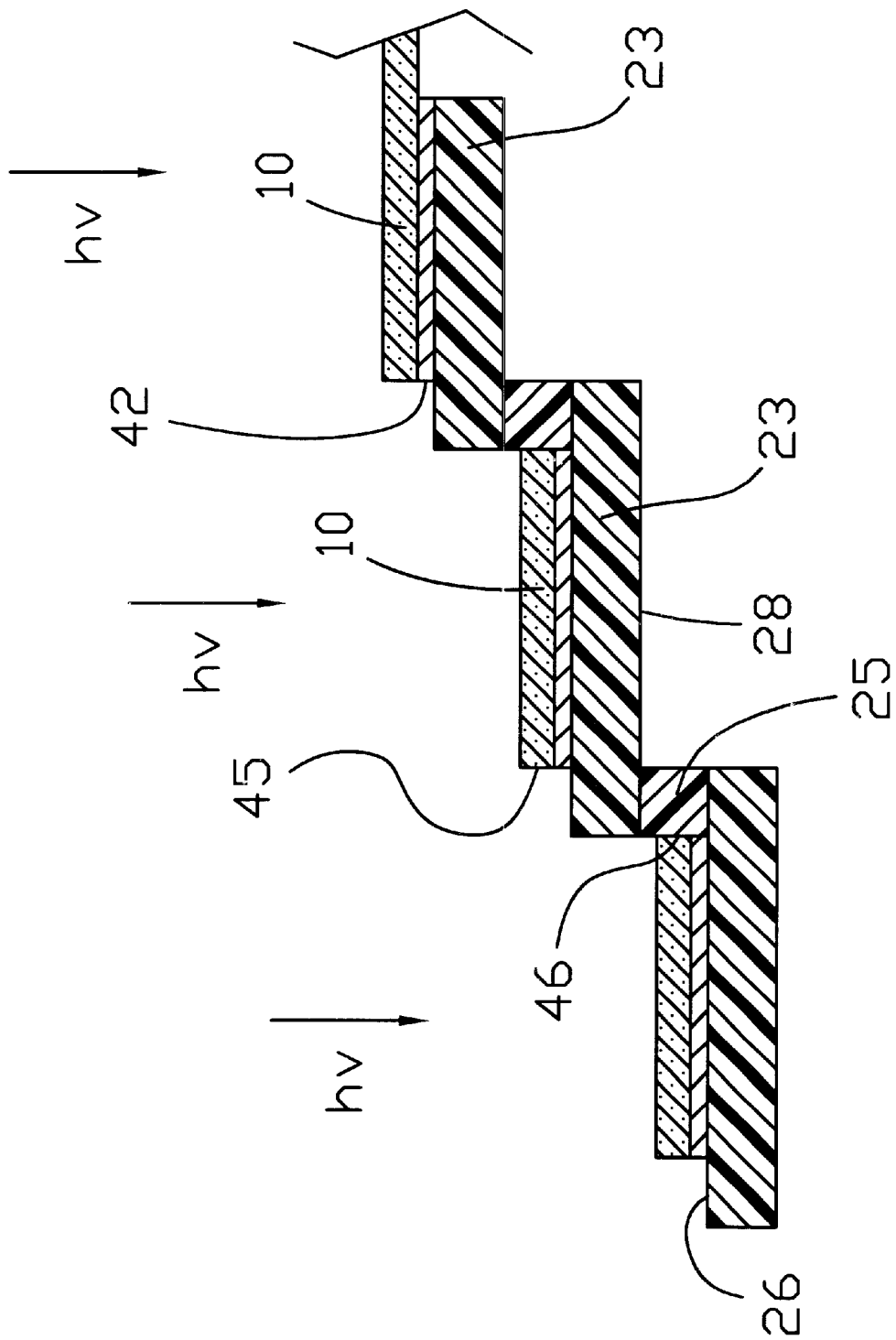

In the FIGS. 15D and 15E discrete units of substrate structure are joined through cells 10. In FIG. 15F multiple units of substrate structure are joined in a integral fashion.

It is important to note that in the embodiments of FIGS. 15A, 15C, 15D 15E, and 15F, the bottom surface 28 of conductive region 23 remains exposed. Those skilled in the art will recognize the advantages of the conductive bottom surface should electroplating of final interconnection (for example, grid fingers) be considered.

Figure 23:
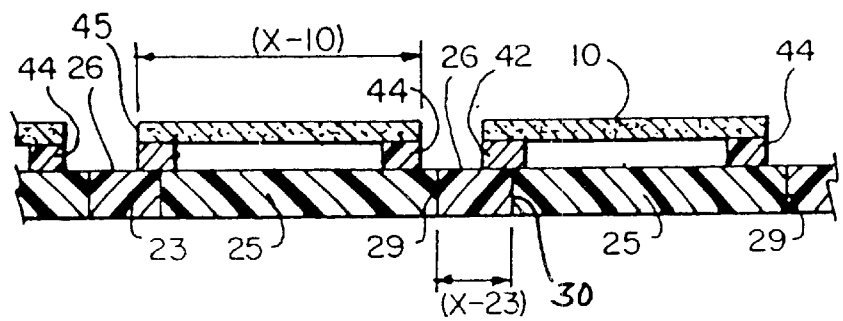
FIG. 23 is a sectional view similar to FIG. 15A but showing an alternate embodiment of the laminated structure.

In the FIGS. 15A, 15B and 15C, the conductive sheets 23, 23a and 23b are shown to be slightly greater in width X-23 than the width of foil X-10. As is shown in FIG. 23, this is not a requirement for satisfactory completion of the series connected arrays. FIG. 23 is a sectional view of a form of the substrate structures of FIGS. 6 and 7 laminated by the process of FIG. 13 to the photovoltaic structures of FIGS. 1–3. In FIG. 23, width X-10 is greater than width X-23. Electrical communication is achieved through conductive joining means 42 and additional joining means 44 to achieve dimensional stability may be employed. The only requirement of the current invention is that first conductive sheet terminal edge 29 be offset from first photovoltaic cell terminal edge 45 to expose a portion of top surface 26 of conductive sheet 23.

Figure 26:
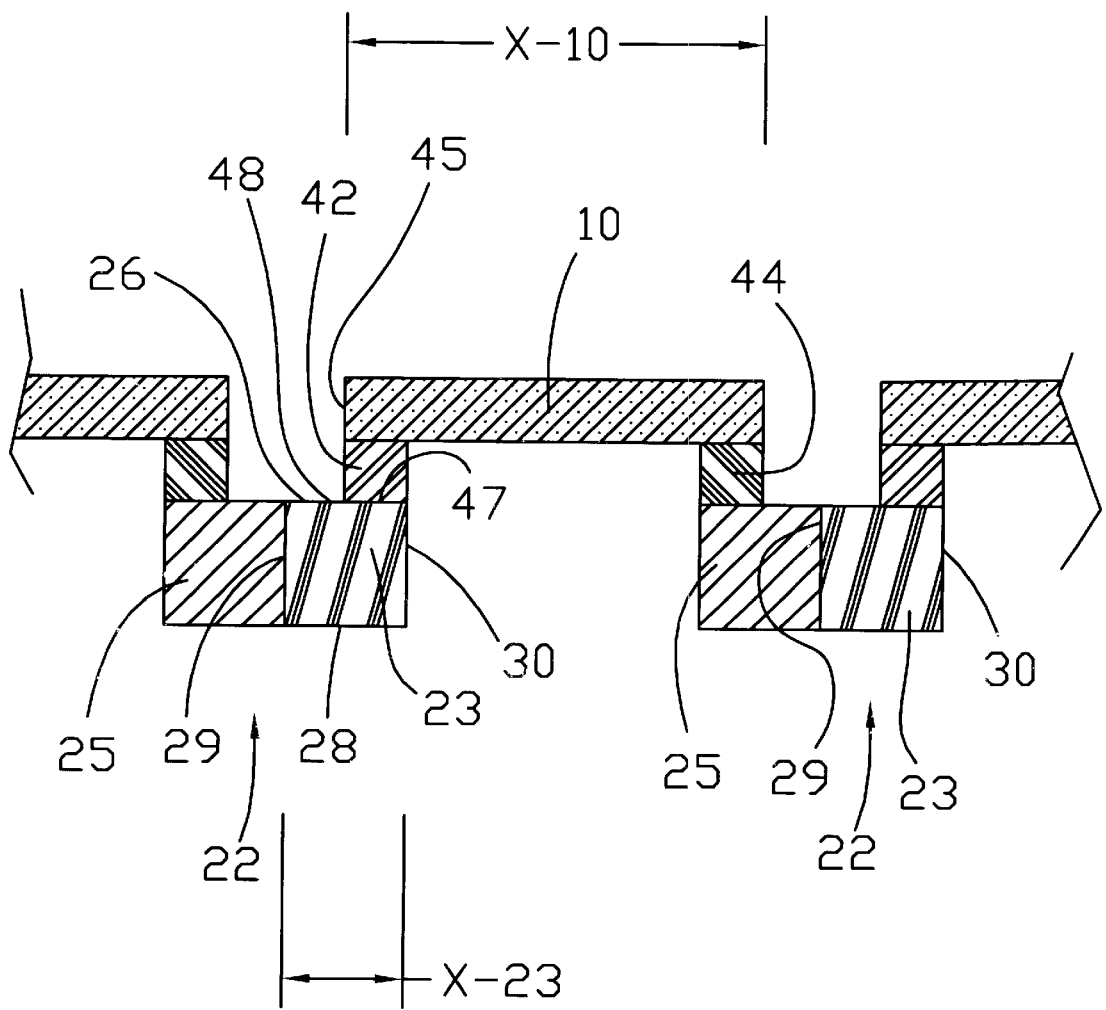
FIG. 26 is a sectional view of another embodiment of a laminated intermediate article in the manufacture of series interconnected arrays.

In FIG. 23, insulating joining portion 25 is shown as extending continuously from second terminal edge 30 of one conductive sheet 23 to the first terminal edge 29 of an adjacent conductive sheet. As shown in FIG. 26, this is not necessary. In FIG. 26, metal foil supported photovoltaic cell 10 is attached to a first conductive sheet 23 through electrically conductive joining means 42 and also to insulating joining portion 25 of an adjacent substrate structure through adhesive 44. Thus, the substrate structure 22 can be discrete. In the embodiment of FIG. 26, the foil based photovoltaic structure 10 is of sufficient strength to maintain proper spaced relationships and positioning among cells.

Figure 16:
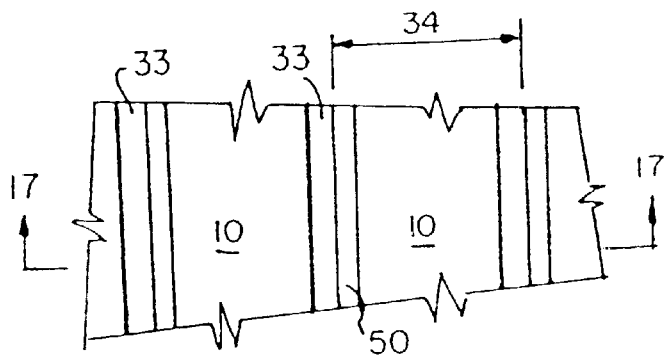
FIG. 16 is a top plan view of the structure resulting from the laminating process of FIG. 13 and using the substrate structure of FIGS. 11 and 12.
Figure 17:
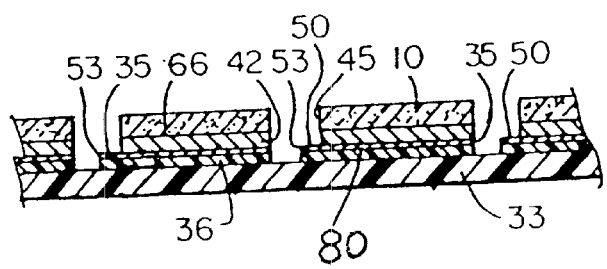
FIG. 17 is a sectional view taken substantially along the line 17—17 of FIG. 16.

Referring now to FIGS. 16 and 17, there is shown an alternate structure resulting from the laminating process of FIG. 13 as applied to the photovoltaic cells of FIGS. 1–3 and the substrate structure of FIGS. 11 and 12. In a fashion similar to that of FIGS. 15, 22, and 23, the first terminal edge 53 of conductive sheets 35 supported by insulating substrate 33 are slightly offset from the first terminal edge 45 of photovoltaic cells 10. This offset exposes a portion of top surface 50 of conductive sheet 35. Electrical and mechanical joining of sheets 35 with second surface 66 of metal-based foil 12 is shown in FIG. 17 as being achieved with conductive adhesive 42 as in previous embodiments. However, it is contemplated as in previous embodiments that this electrical and mechanical joining can be accomplished by alternate means such as soldering, joining with compatible low melting point alloys, spot welding, or mechanical crimping.

In the FIG. 17, support structure 33 is shown as extending continuously among many cells. However, it should be clear that support film 33 can be discontinuous. Support film 33 need only be attached to a portion of a first sheet 35 associated with a first cell and a portion of the bottom surface 66 of an adjacent cell. This arrangement would suffice to achieve the desired spacial positioning among cells and leave exposed a portion of back surface 80 of electrically conductive sheet 35.

Referring to FIGS. 14 through 17, those skilled in the art will recognize that the process of FIGS. 13A and 13B results in a substantially planar sheet comprising photovoltaic cells positioned on a substrate having selected conductive and non-conductive regions. Further comparing the sectional views of FIGS. 15, 22, 23 and 17, one observes many similarities. The most important common structural similarity is that the first terminal edges 29 of conductive sheets 23 be offset slightly from first terminal edge 45 of photovoltaic cells 10 (FIGS. 15, 22, 23). Similarly, first terminal edges 53 of conductive sheets 35 are slightly offset from first terminal edges 45 of photovoltaic cells 10 (FIG. 17). As will be shown, the resulting exposed top surface portions are used as contact surfaces for the final interconnected array.

Figure 24:
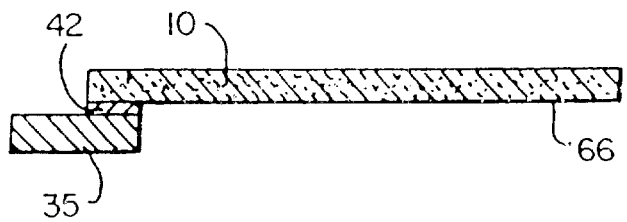
FIG. 24 is a sectional view of an alternate embodiment.
Figure 25:
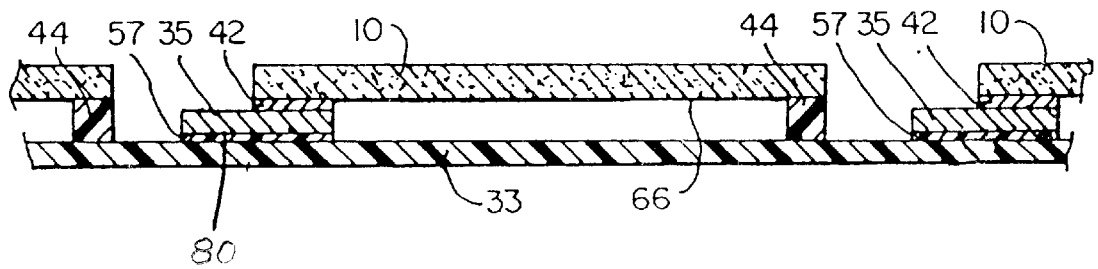
FIG. 25 is a sectional view of the embodiment of FIG. 24 after a further processing step.

It should also be observed that the structures equivalent to those shown in FIGS. 16 and 17 can also be achieved by first joining photovoltaic cells 10 and conductive sheets 35 with suitable electrically conductive joining means 42 to give the structure shown in FIG. 24 and laminating these strips to an insulating support web 33. An example of such an equivalent structure is shown in FIG. 25, wherein the laminates of FIG. 24 have been adhered to insulating web 33 in defined repeat positions with adhesive means 57 and 44. As mentioned above and as shown in FIGS. 24 and 25, conductive sheets 35 do not have to contact the whole of the bottom surface 66 of photovoltaic cell 10. In addition, support web 33 need not be continuous among all the cells. The support web 33 need only extend from the adhesive means 57 of one cell to the adhesive attachment 44 of an adjacent cell. This arrangement would leave a portion of the bottom surface 66 of foil 12, and perhaps a portion of the bottom surface 80 of conductive sheet 35 exposed.

Figure 18:
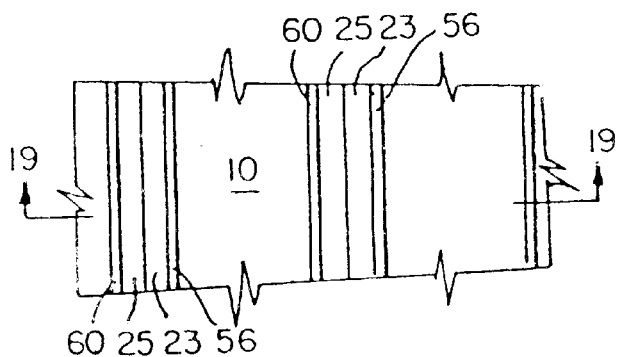
FIG. 18 is a top plan view of the structures of FIGS. 14A and 15A but following an additional step in manufacture of the interconnected cells.
Figure 19:
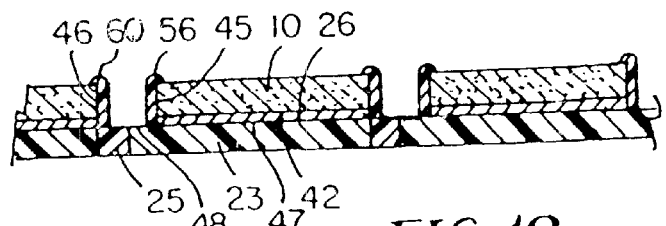
FIG. 19 is a sectional view taken substantially along the line 19—19 of FIG. 18.

Referring now to FIGS. 18 and 19, insulating beads 56 and 60 of insulating material having been applied to the first and second terminal edges 45 and 46 respectively of photovoltaic cells 10. While these beads 56 and 60 are shown as applied to the structure of FIG. 15a, it is understood that appropriate beads of insulating material are also envisioned as a subsequent manufacturing step for the structures of 15b, 15c, 17, 22, 23, 25, and 26. The purpose of the insulating beads is to protect the edge of the photovoltaic cells from environmental and electrical deterioration. In addition, as will be shown the insulating bead allows for electrical interconnections to be made among adjacent cells without electrical shorting.

It is noted that the application of insulating material 56 to first terminal edge 45 of photovoltaic cells 10 effectively divides the top surfaces 26 and 50 of conductive sheets 23 and 35 respectively into two regions. The first region (region 48 of surface 26 or region 52 of surface 50) can be considered as a contact region for series interconnects among adjacent cells. The second region (region 47 of surface 26 or region 51 of surface 50) can be considered as the contact region for interconnecting the substrate to the second surface 66 of photovoltaic cells 10.

Figure 20:
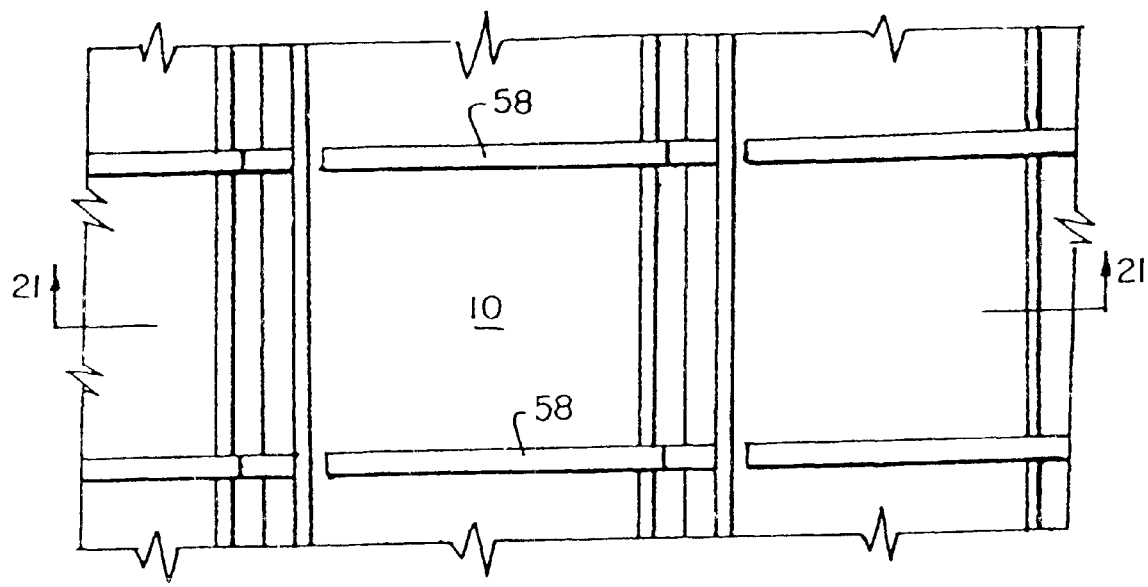
FIG. 20 is a top plan view of a completed interconnected array.
Figure 21:
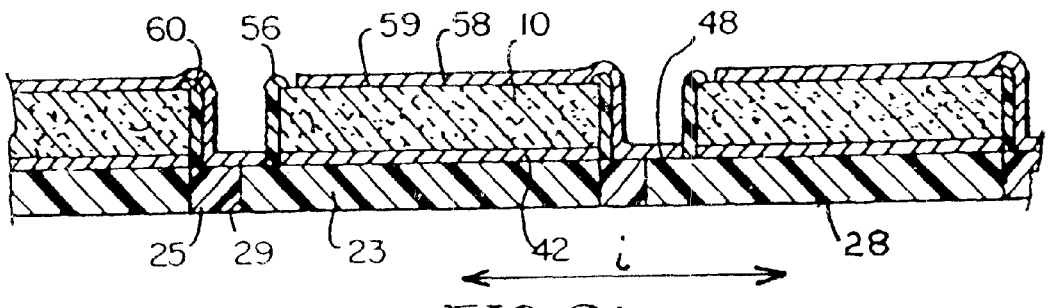
FIG. 21 is a sectional view taken substantially along line 21—21 of FIG. 20.

Referring now to FIGS. 20 and 21, there is shown the method of forming the final interconnected array. Grid fingers 58 of a highly electrically conductive material are deposited to achieve electrical communication between the top surface 59 of the photovoltaic cell 10 and the remaining exposed contact regions 48 or 52 of an adjacent cell. It is contemplated that these fingers can be deposited by any of a number of processes to deposit metal containing or metal-based foils or films, including masked vacuum deposition, printing of conductive inks, electrodeposition or combinations thereof. The grid fingers are not considered to be a part of the substrate structure since they do not contribute to supporting and spacial positioning of the cells. They serve only to achieve final electrical interconnection. In FIGS. 20 and 21, the direction of net current flow through the interconnected array illustrated is indicated by the arrow identified as "i", which direction is substantially parallel to width X-23 of electrically conductive region 23 of unit of substrate 22.

Figure 27:
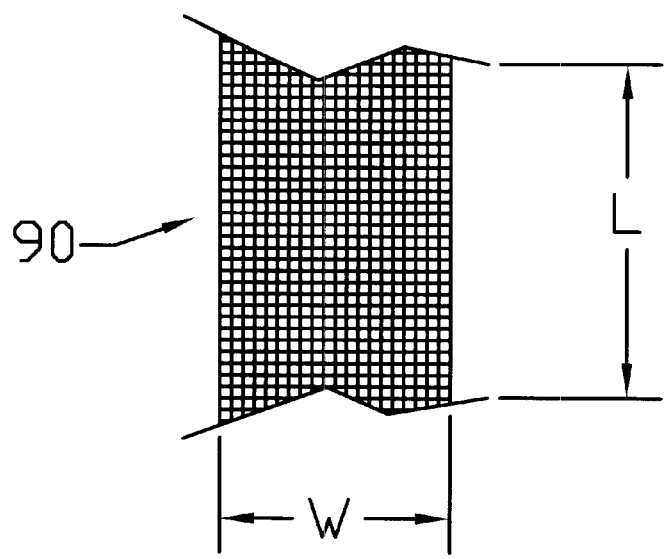
FIG. 27 is a top plan view of a starting material for another embodiment of substrate structure.

Referring now to FIG. 27, the starting material for yet another embodiment is illustrated in plan view. Material 90 comprises a web, mesh or fabric and is characterized by having a width "W" and length "L". It is contemplated that length "L" is considerably greater than width "W" and length "L" can generally be described as "continuous" or being able to be processed in a roll-to-roll fashion.

Figure 28:
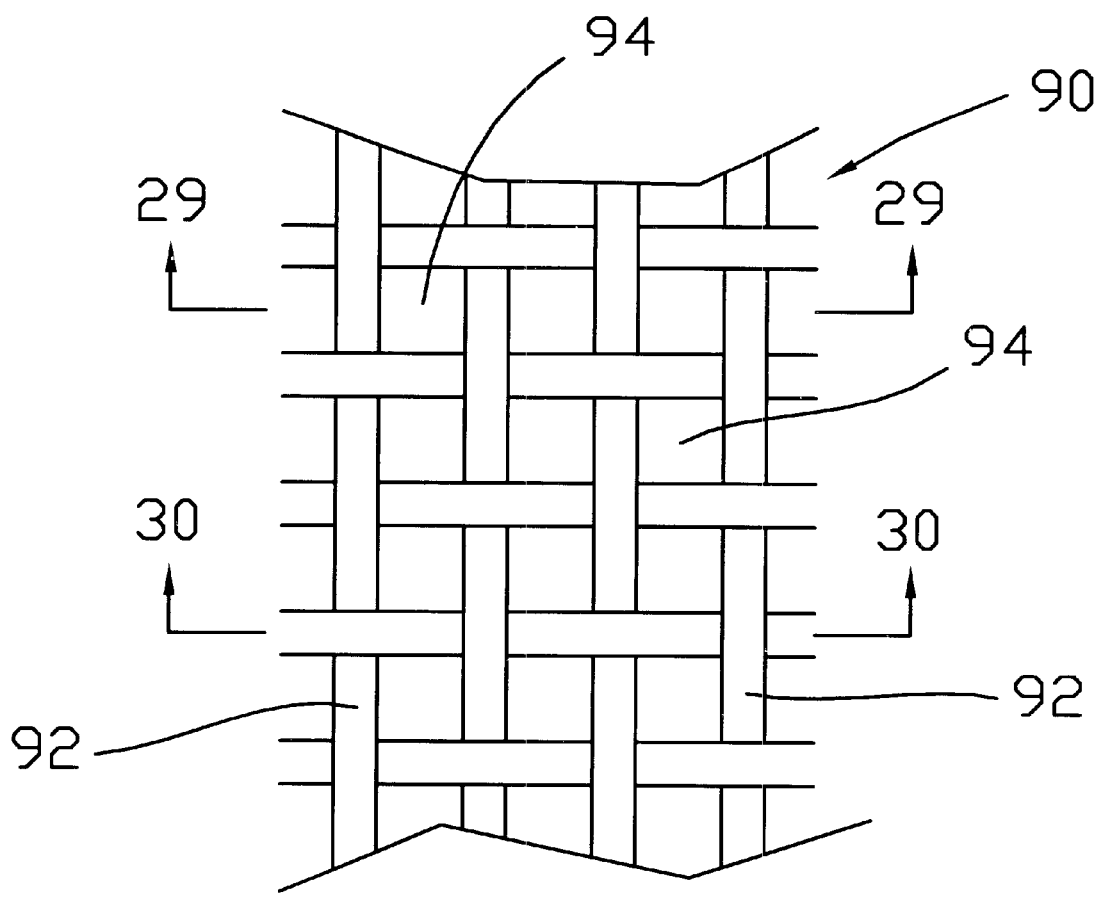
FIG. 28 is a greatly magnified plan view of the material of FIG. 27.

FIG. 28, a greatly magnified plan view of a portion of the structure of FIG. 27, shows the material 90 comprising fibrils 92 interwoven to form a sturdy structure. Holes 94 are present among the interwoven fibrils. It is understood that the fibrils need not be actually interwoven as shown. Equivalent structures comprising fibrils and holes, such as polymeric non-woven fabric or adhesively bonded fibril mats, can be employed.

Figure 29:
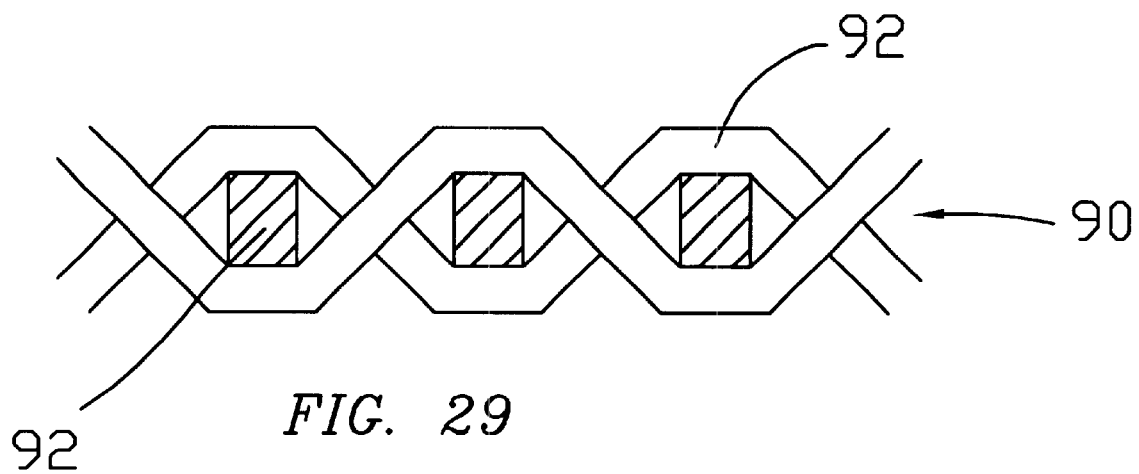
FIG. 29 is a sectional view taken substantially along line 29—29 of FIG. 28.
Figure 30:
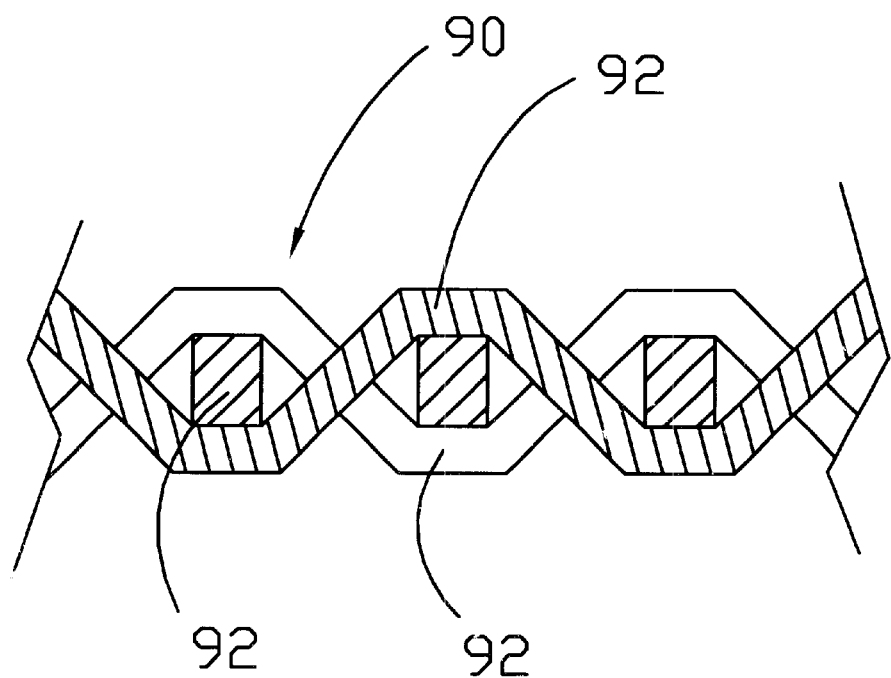
FIG. 30 is a sectional view taken substantially along line 30—30 of FIG. 28.

FIGS. 29 and 30 are sectional views of the embodiment of FIG. 28 taken substantially along line 29—29 and line 30—30 of FIG. 28 respectively.

Figure 31:
FIG. 31 is a simplified sectional view representing the structure depicted in FIGS. 29 and 30.

FIG. 31 is a greatly simplified sectional representation of the structure depicted in FIGS. 29 and 30. This simplified representation of FIG. 31 is useful in the illustration of subsequent embodiments.

Figure 32:
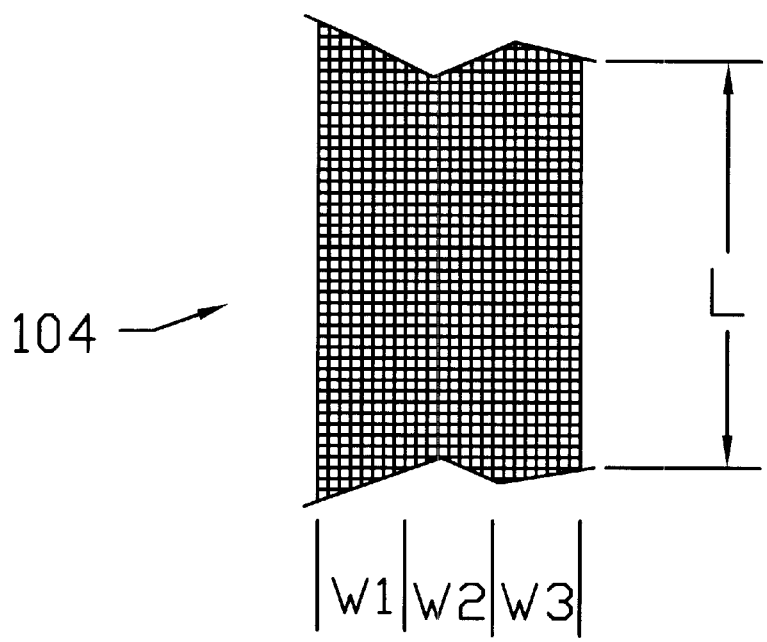
FIG. 32 is a view similar to FIG. 27 but defining three distinct area portions of the structure produced by a process step.

Referring now to FIG. 32, there is shown the material shown in FIG. 27 following an additional processing step.

The material of width "W" is now generally designated as 104 to indicate this additional process step. Width "W" has been further defined as comprising three minor widths "W1", "W2", and "W3". Each of these widths "W1", "W2", and "W3" is understood to extend along length "L" as indicated. In light of the following description and embodiments, it will be understood by those skilled in the art that regions "W1" and "W3" need not contain holes 94 but may be chosen to be a solid sheetlike film. Furthermore, region "W3" may be eliminated entirely in some embodiments.

Figure 33:
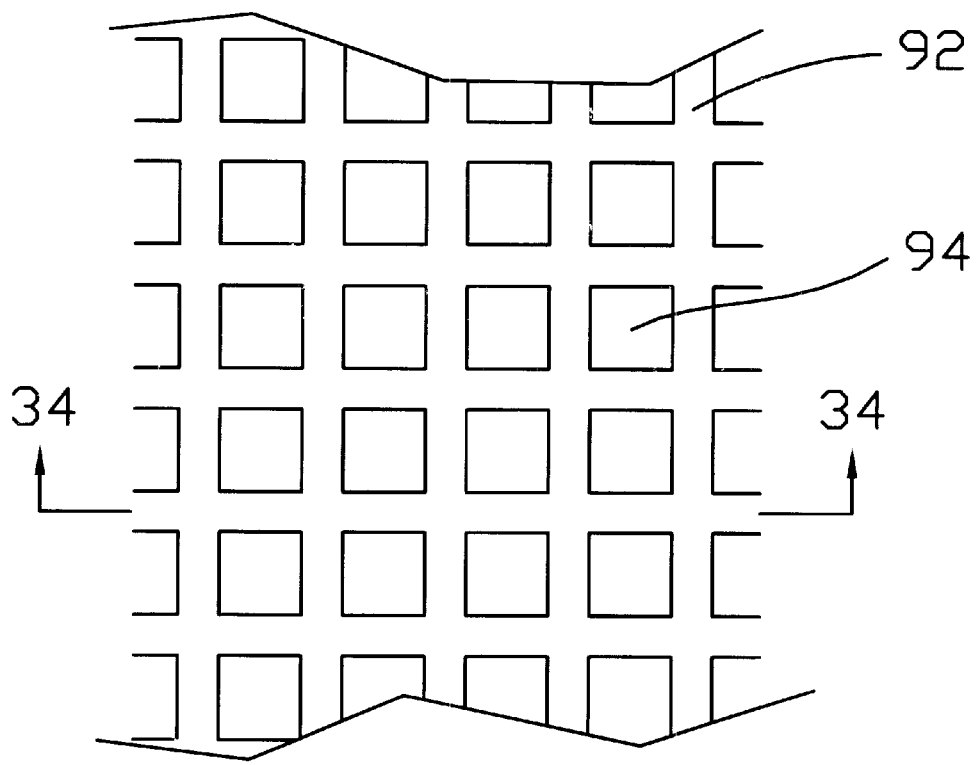
FIG. 33 is a greatly magnified plan view of that portion of FIG. 32 defined by W2.
Figure 34:
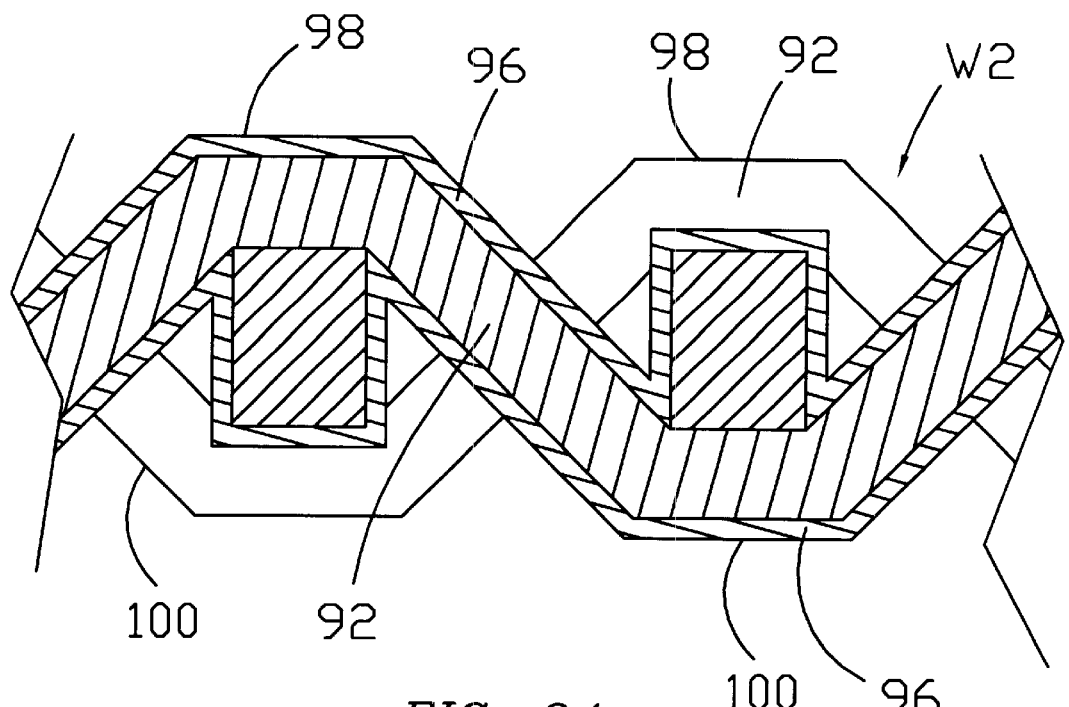
FIG. 34 is a greatly magnified sectional view of a portion of the structure of FIG. 33 taken substantially from the perspective of line 34—34 of FIG. 33.

FIG. 33 is a greatly magnified plan view of the portion of FIG. 32 structure identified as minor width "W2". In contrast to the plan view shown in FIG. 28, the structure of FIG. 33 appears continuous in the two-dimensional plan view. This continuity results from coating the fibrils with an electrically conductive coating. The structure of the coated fibrils is best shown in the sectional view of FIG. 34, which is a view taken substantially along line 34—34 of FIG. 33. In FIG. 34, fibrils 92 in the region "W2" have been coated with electrically conductive coating material 96. It is anticipated that coating 96 and the deposition process for applying coating 96 can be chosen from any number of suitable techniques. Included in such techniques are painting, dipping, or printing of conductive inks, laminating, and masked chemical or vapor deposition of metals or other conductive materials. In the case of a temperature resistant fabric such as fiberglass, deposition of a low melting point metal such as solder could be employed. A particularly advantageous coating 96 to prepare the structure of FIG. 34 is DER applied using a paint solution or paste. The DER is inexpensive, and readily formulated and applied from solution form.

The important feature of the structure of FIG. 34 is that through-hole electrical communication extends from the top surface 98 to the bottom surface 100 in the region defined by "W2" of FIG. 34. This situation is readily achieved by using the coated fabric approach of the present embodiments.

Figure 35:
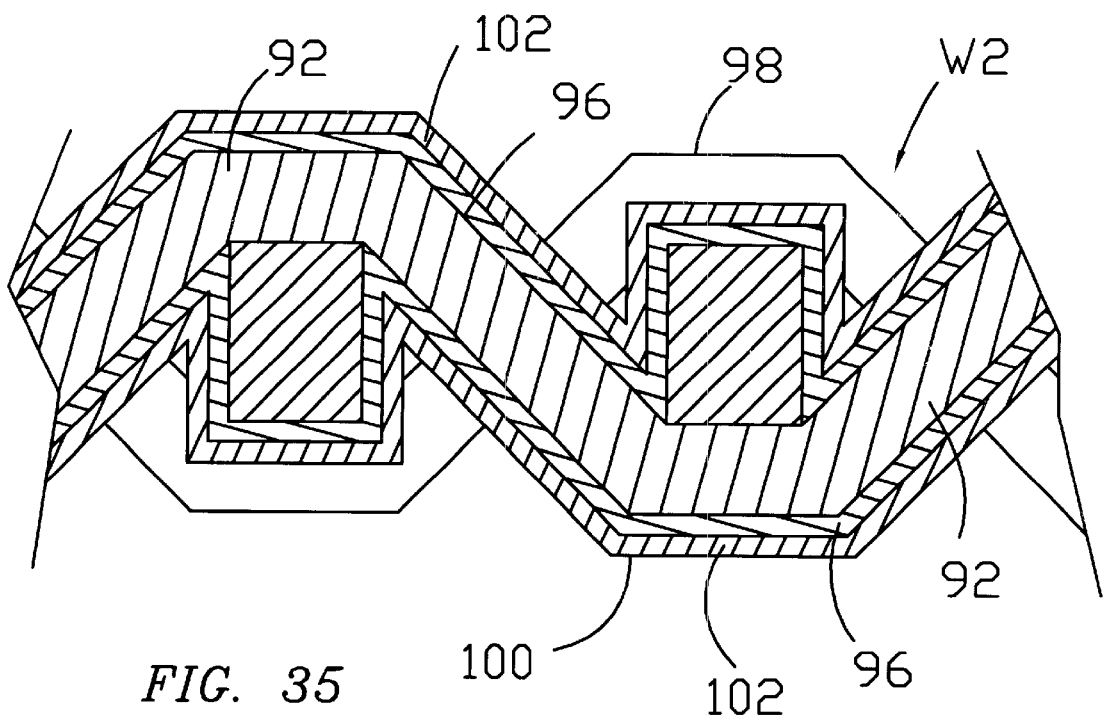
FIG. 35 is a sectional view similar to FIG. 34 showing the structure following an optional additional process step.

FIG. 35 is a sectional view similar to FIG. 34 following an additional optional process step. In FIG. 35, the electrical conductivity and mechanical and environmental integrity of the structure is further enhanced by applying an additional highly conductive coating 102 overlaying coating 96. This subsequent coating 102 can be conveniently applied by metal electrodeposition. The structure of FIG. 35 gives highly conductive communication equivalent to a metal screen from top surface 98 to bottom surface 100 in region "W2" by virtue of the through-hole electrodeposition.

Figure 36:
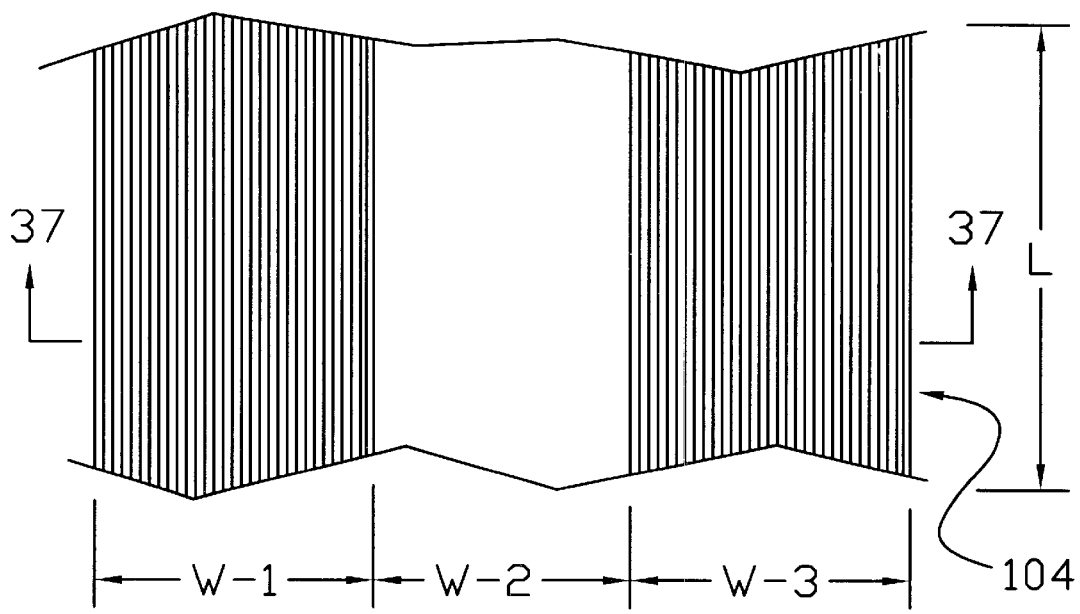
FIG. 36 is a simplified plan view of the structure of FIG. 32 useful in illustrating the process and structure of the embodiment.
Figure 37A:
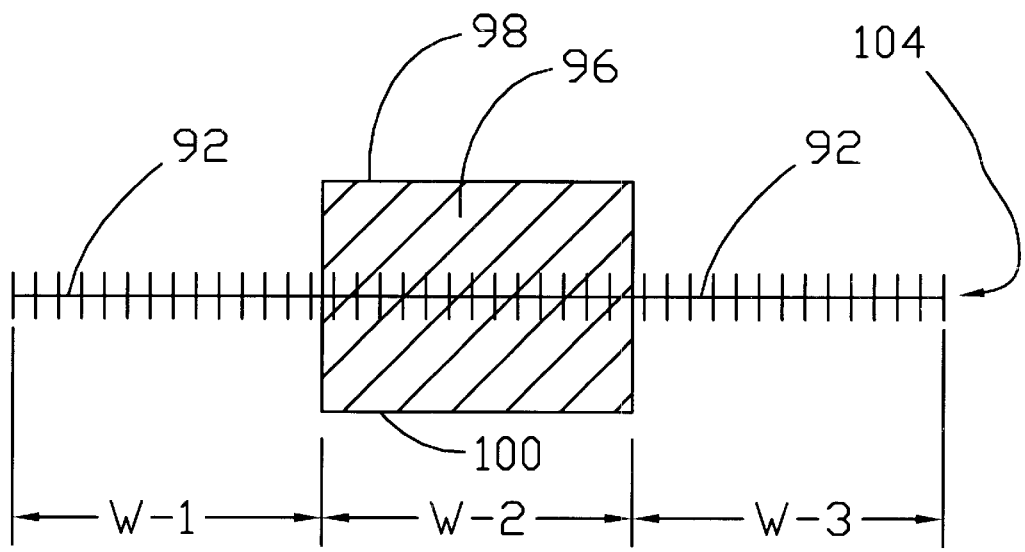
FIG. 37A is a simplified sectional view taken substantially along line 37—37 of FIG. 36, useful in illustrating the process and structure of the embodiment.
Figure 37B:
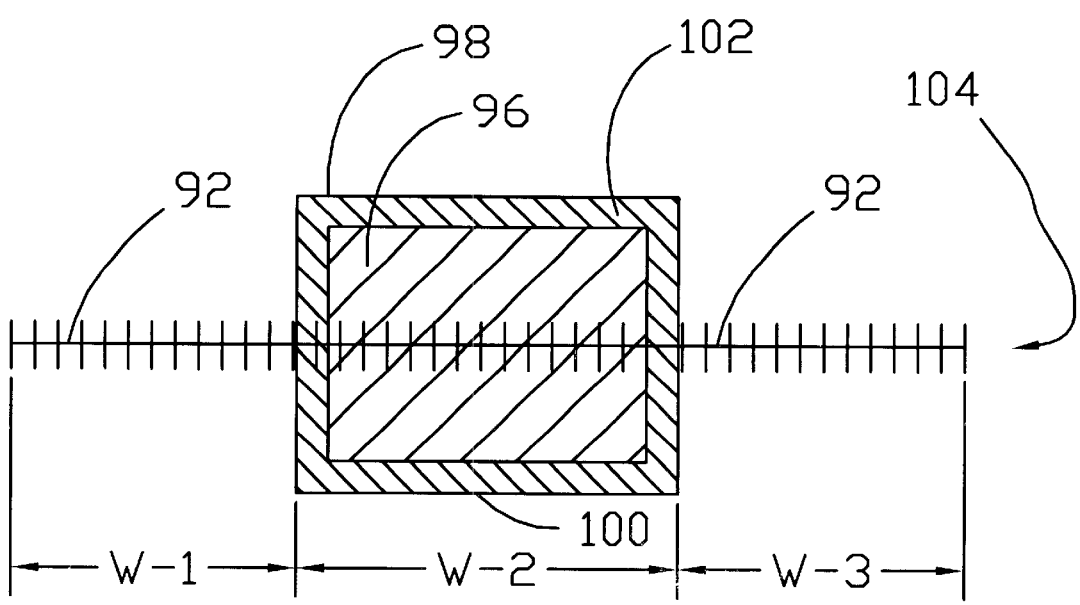
FIG. 37B is a simplified sectional view similar to FIG. 37A incorporating an optional additional process step.

Referring now to FIGS. 36, there is shown a simplified plan view of the 104 structure intended to facilitate teaching of the processing steps envisioned to accomplish manufacture of the series connected photovoltaic arrays using the substrate structure 104. In FIG. 36, the regions "W1" and "W3" have structure shown in detail in FIGS. 28–30. In FIG. 36, region "W2" has structure shown in detail in FIGS. 33 and 34 and optionally FIG. 35. Referring now to FIG. 37A, there is shown a simplified sectional view of the 104 structure employing the "W2" structure depicted in FIG. 34. FIG. 37B shows a similar view of the 104 structure employing the "W2" structure depicted in FIG. 35. These simplifications will help illustration of the processing steps and the structures resulting from these processing steps.

Figure 37C:
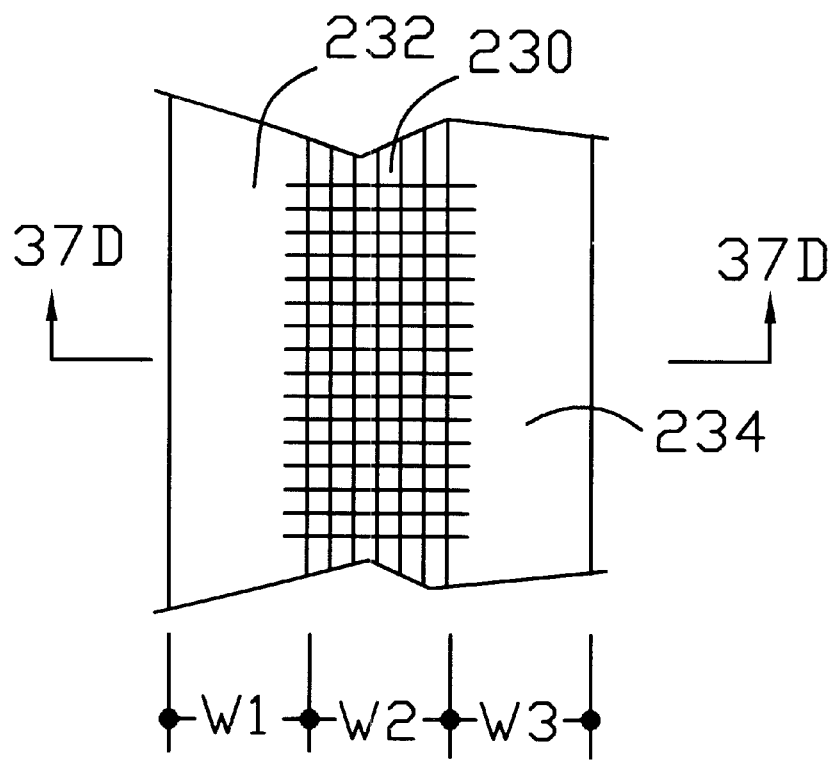
FIG. 37C is a plan view similar to FIG. 36 of an additional embodiment.
Figure 37D:
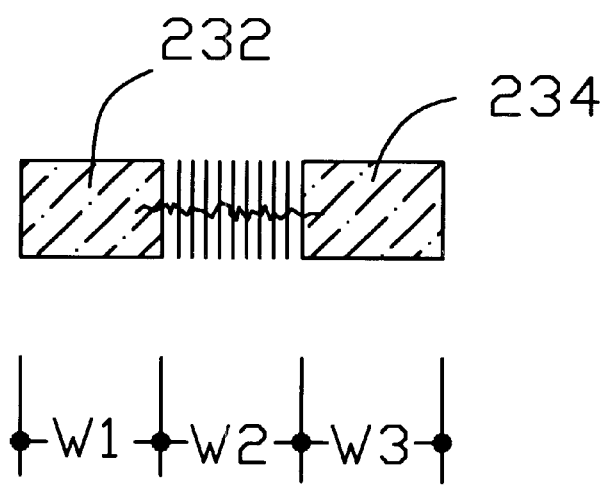
FIG. 37D is a sectional view taken substantially along the line 37D—37D of FIG. 37C.

FIGS. 37C and 37D show an alternate embodiment. In the FIGS. 37C and 37D numeral 230 indicates a metal mesh or screen whereas 232 and 234 represent a polymer based film or web joined to metal screen 230. This is an equivalent alternate structure to that of 37A and 37B.

Figure 38:
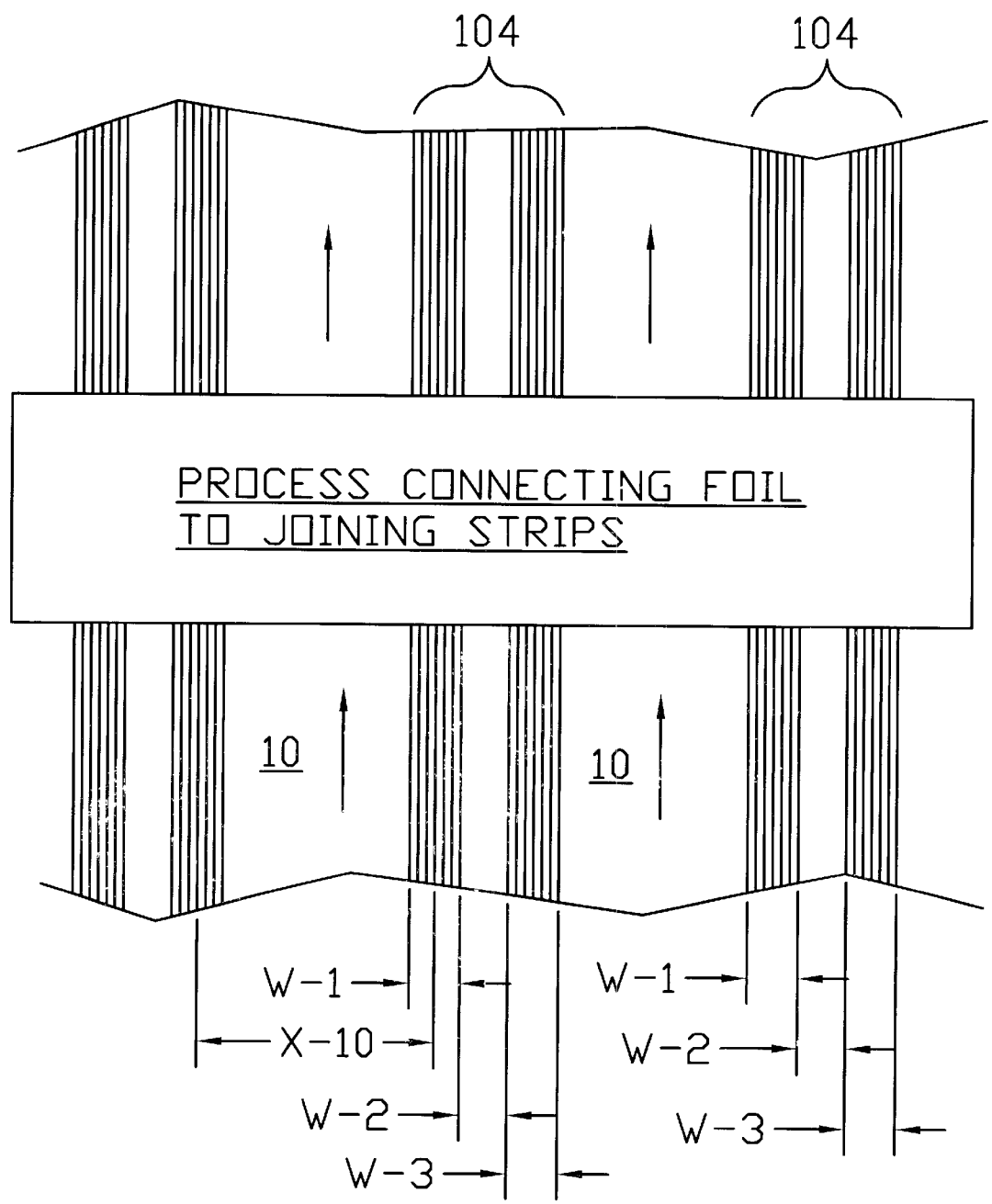
FIG. 38 is a schematic depiction of a process for joining the foil supported thin film photovoltaic structure of FIGS. 1 through 3 to the substrate structure of FIGS. 32 or 36.

Referring now to FIG. 38 there is shown a schematic depiction of a process for joining the foil supported thin film photovoltaic structure of FIGS. 1 through 3 with the substrate strips 104. Photovoltaic cells 10 are continuously fed to the process in spaced relationship to substrate strips 104. The process accomplishes attaching one edge portion of cells 10 to a portion "W3" of one substrate strip 104 and an opposite edge portion of cells 10 to a portion "W1" of a second substrate strip 104.

Figure 39:
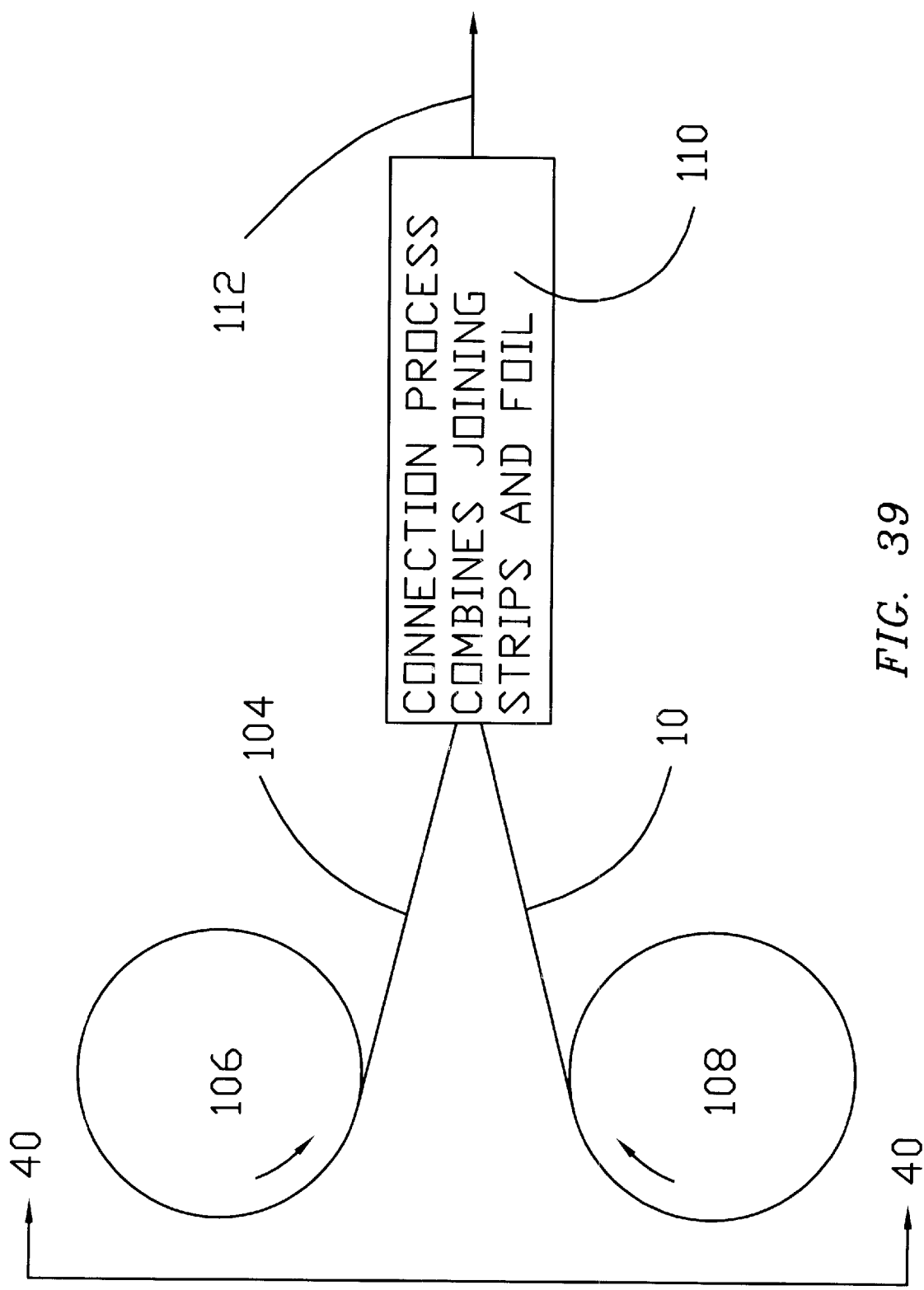
FIG. 39 illustrates one form of the process depicted in FIG. 38.
Figure 40:
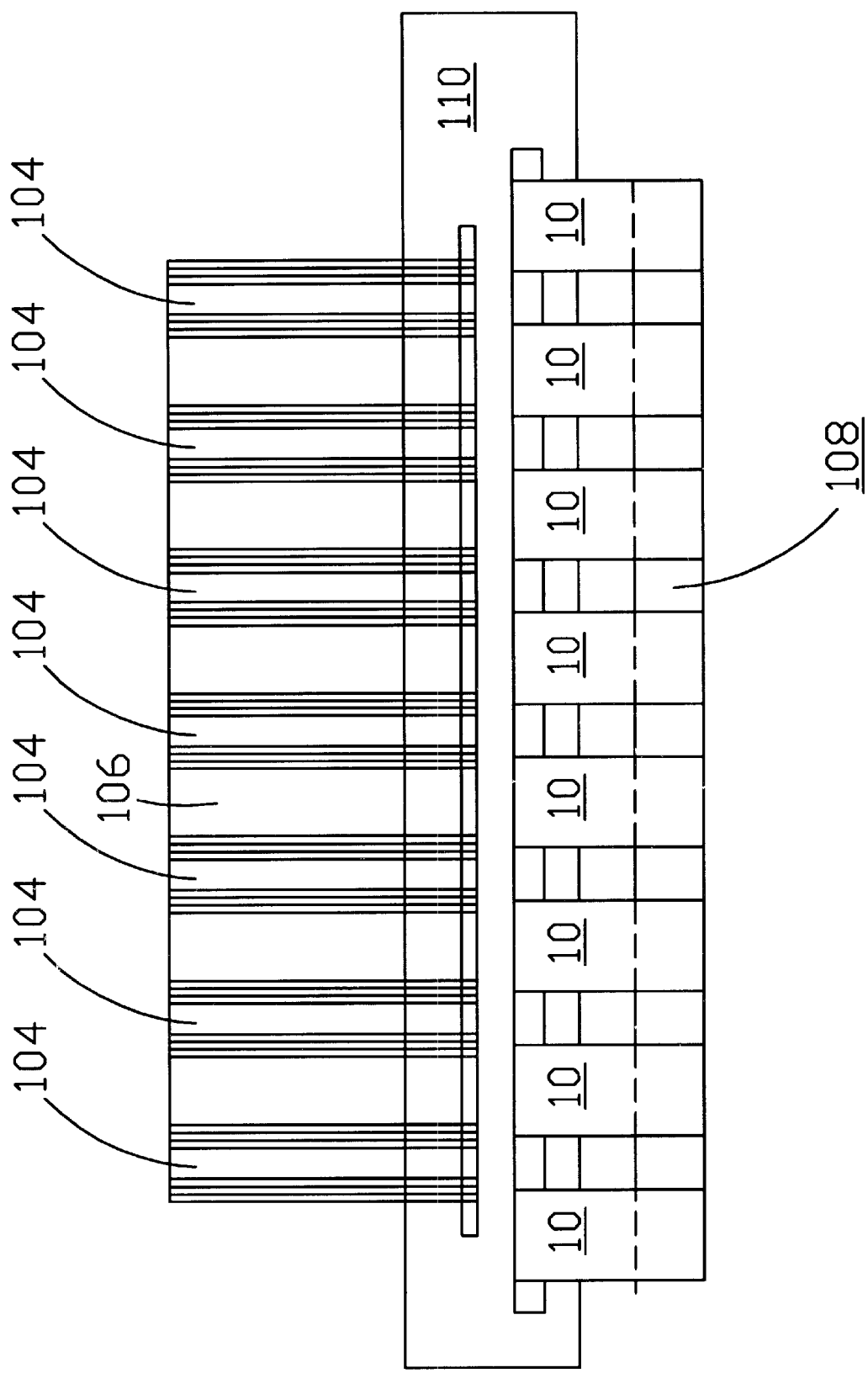
FIG. 40 is a view of the process of FIG. 39 taken substantially along line 40—40 of FIG. 39.

FIGS. 39 and 40 illustrate the process of FIG. 38 in more detail. In FIG. 39, spacially positioned substrate strips 104 are continuously fed to the joining process 110 from roll 106. Spacially positioned photovoltaic cells 10 are continuously fed to the process 110 from roll 108. The resultant combined structure is designated by the numeral 112.

FIG. 40 illustrates the process of FIG. 39 from the perspective of line 40—40 of FIG. 39.

Figure 41:
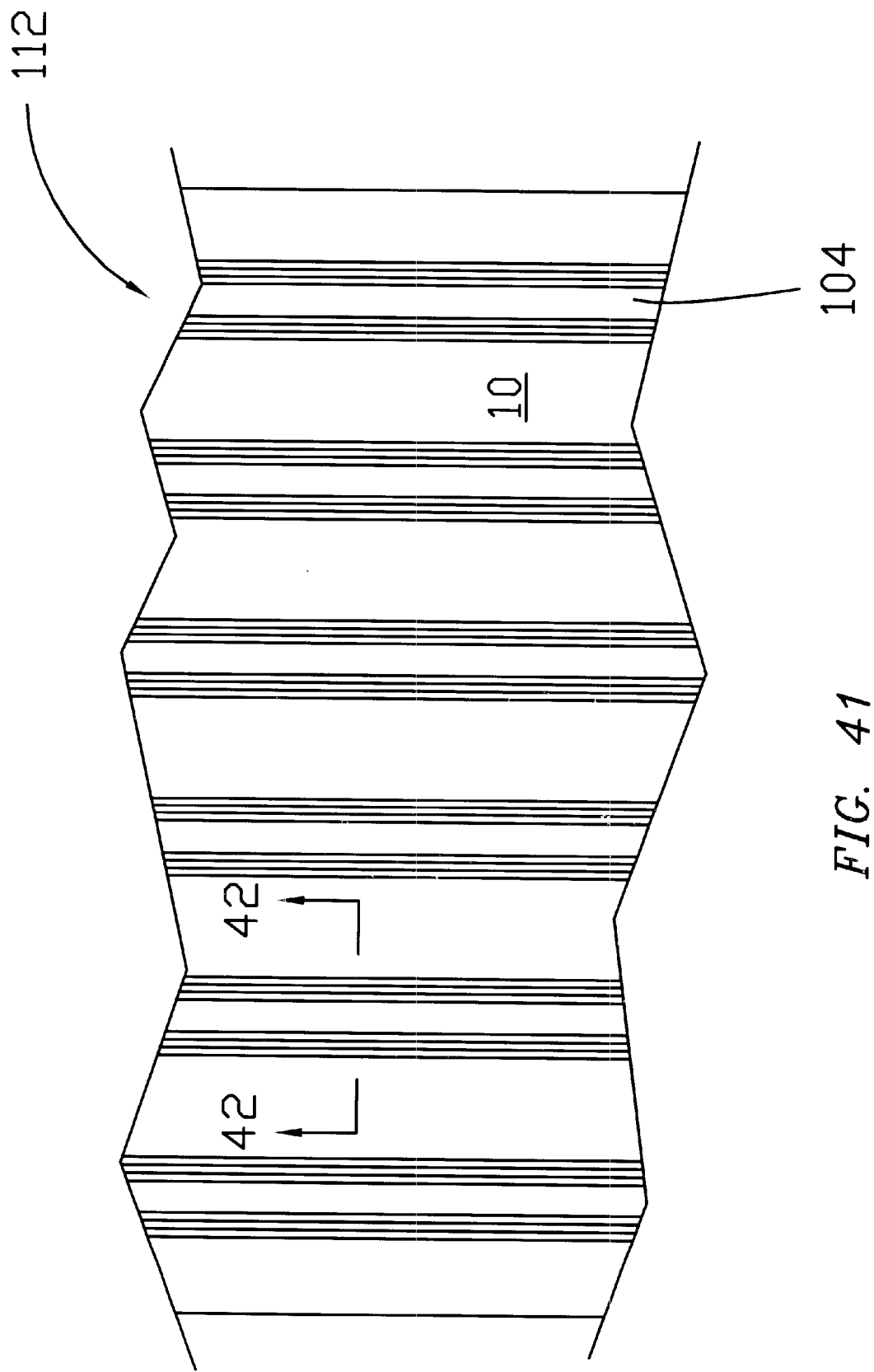
FIG. 41 is a plan view of the structure resulting from the process of FIG. 38.

FIG. 41 is a plan view of the combined structure resulting from joining process 110.

Figure 42A:
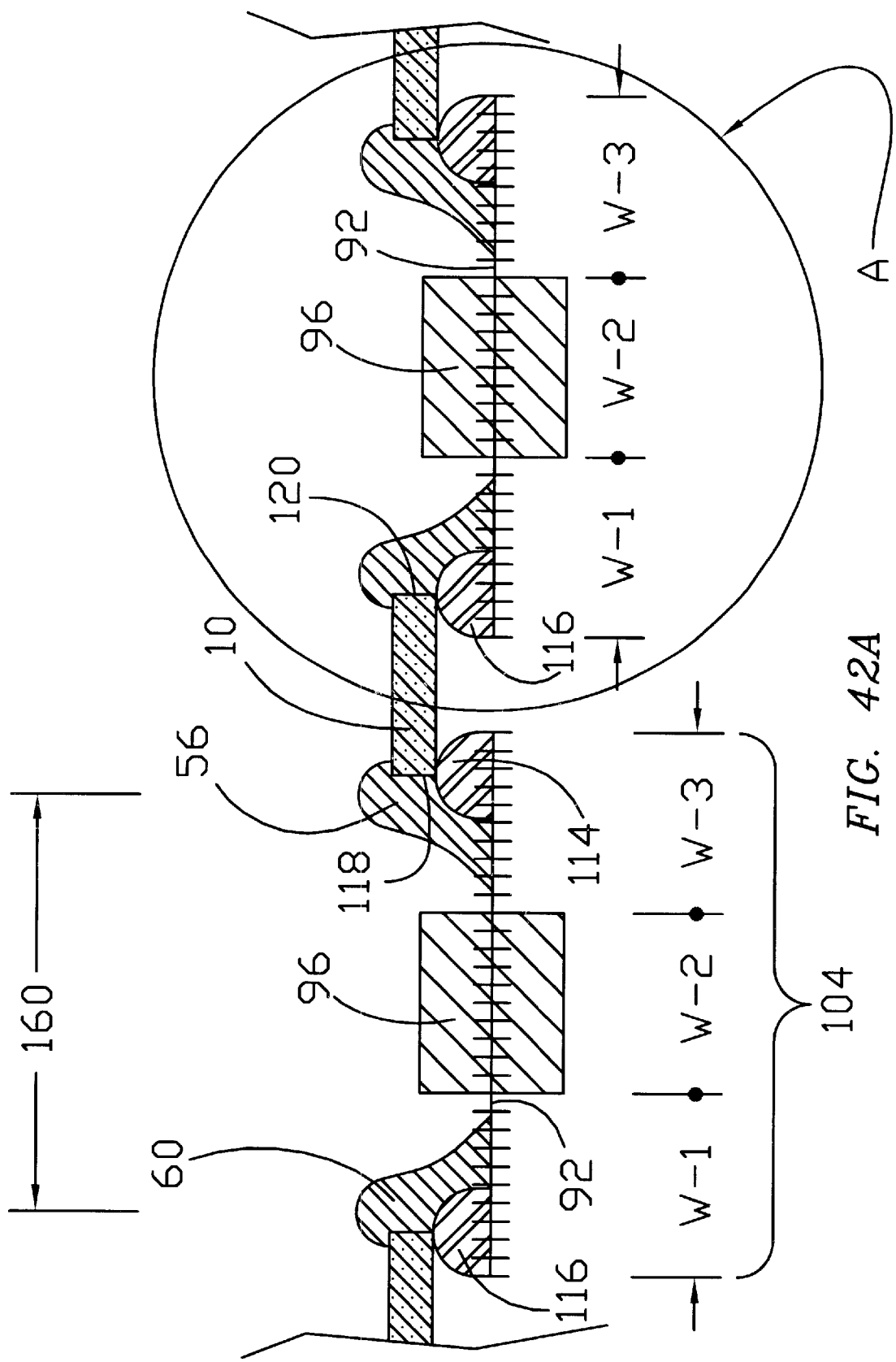
FIG. 42A is an embodiment of the structure of FIG. 41 taken substantially along line 42—42 of FIG. 41.

FIG. 42A is a simplified sectional view taken substantially along line 42—42 of FIG. 41 of the product from process 110 when structure 104 shown in FIG. 37A is employed. Adhesive bead 114 is used to attach a first edge portion 118 of photovoltaic cell structure 10 to portion "W3" of a substrate strip and adhesive bead 116 attaches the second edge portion of cell 10 to portion "W1" of another substrate strip. Insulating beads 56 and 60 protect the first and second terminal edges of photovoltaic cells 10.

Figure 42B:
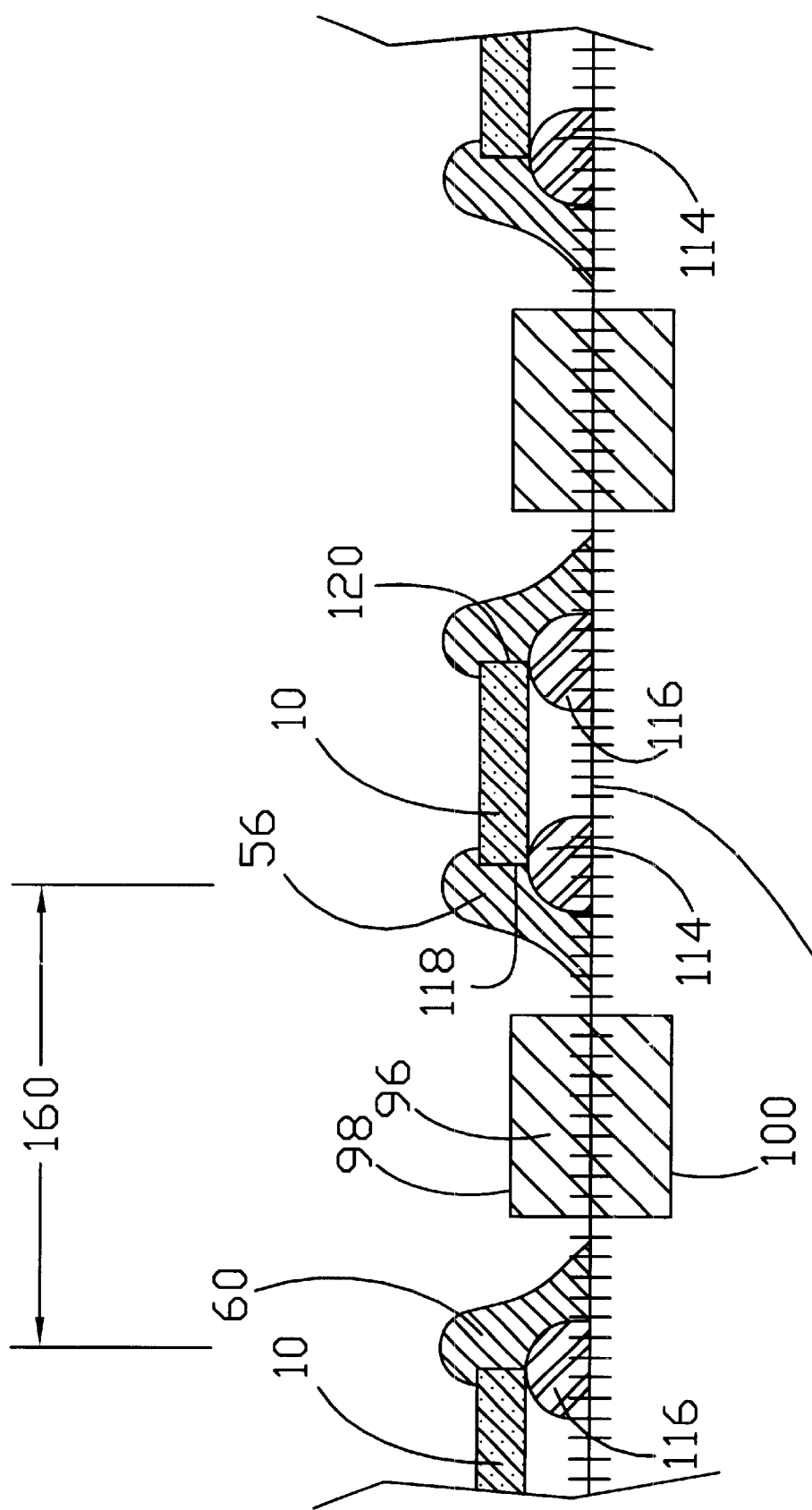
FIGS. 42B and 42C are views similar to 42A showing alternate embodiments of the structure depicted in FIG. 41.

FIG. 42B is a structure similar to 42A but shows that the substrate structure need not be discrete strips but can be joined. This is equivalent to stating the portion "W1" of one strip is joined to portion "W3" of another strip. Maintenance of spacial positioning and mechanical integrity are promoted by the structure depicted in FIG. 42B.

Figure 42C:
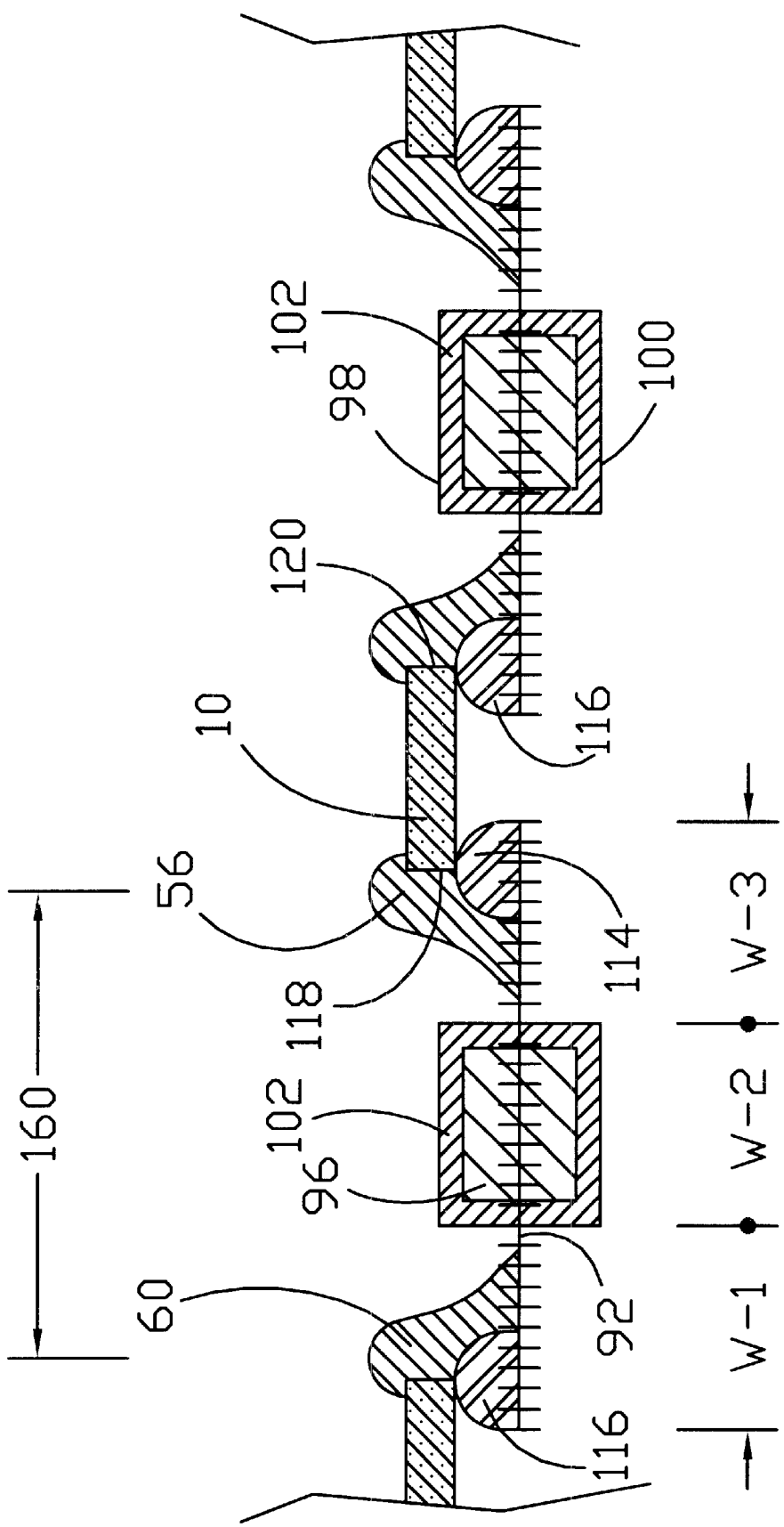

FIG. 42C is a view similar to 42a but employing the substrate structure 104 shown in FIG. 37B.

Figure 42D:
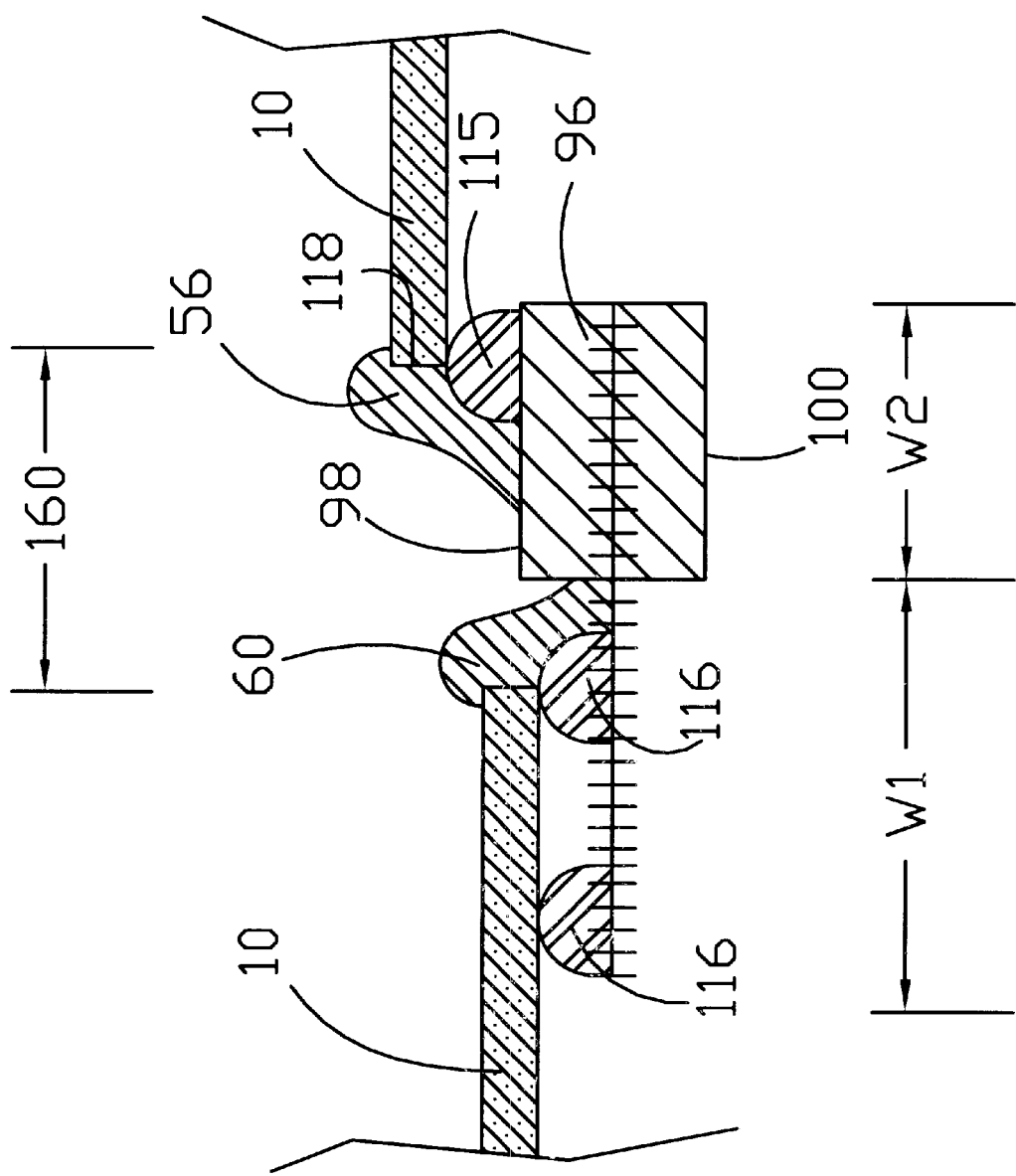
FIG. 42D is a sectional view similar to FIGS. 42A–42C of an additional embodiment.

FIG. 42D shows that portion "W3" of the prior embodiments may be eliminated. In this case terminal edge 118 of cell 10 is attached via adhesive bead 115 to upper surface 98 of portion "W2". It is advantageous to choose a conductive adhesive for bead 115 of FIG. 42D since this facilitates final interconnection of the array or module.

Figure 43:
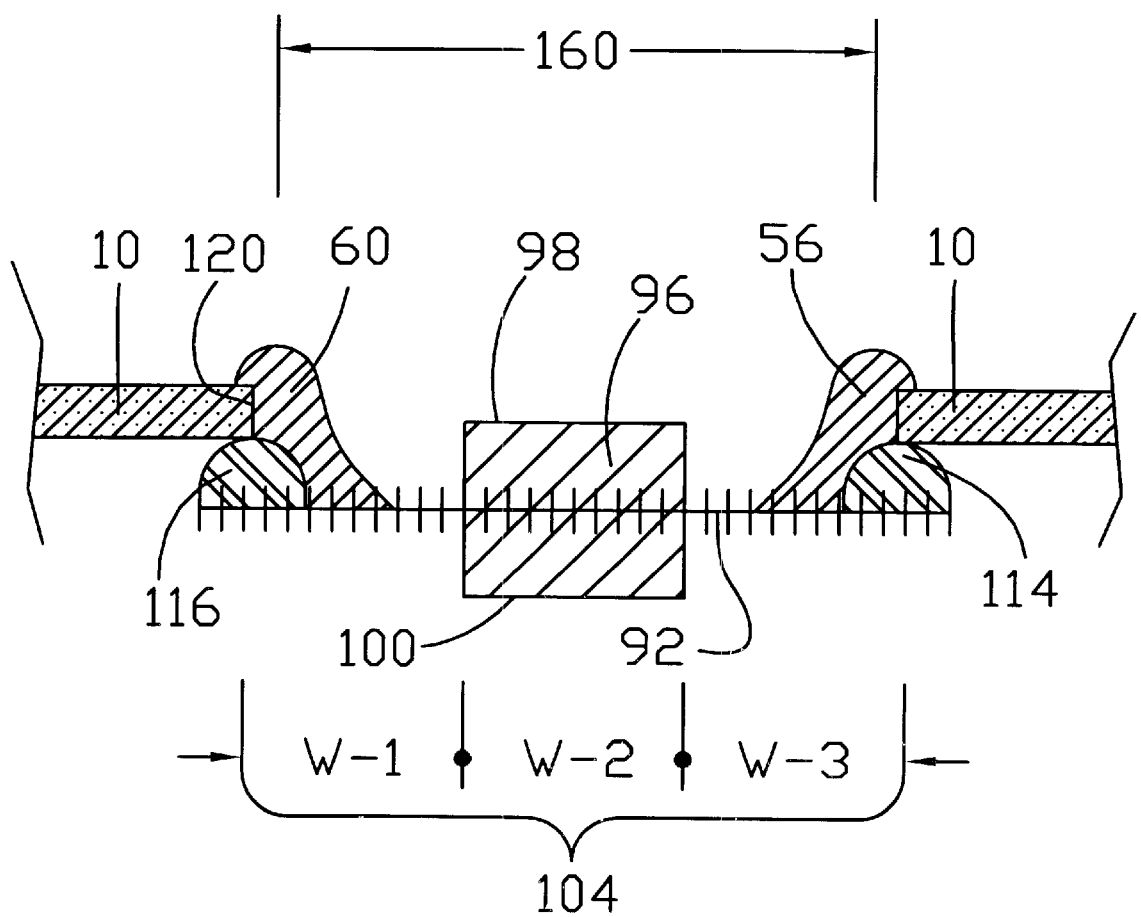
FIG. 43 is an enlarged view of the portion of FIG. 42A shown within circle "A".

FIG. 43 is an enlarged view of the structural portion within circle "A" of FIG. 42A.

Referring to FIGS. 42 A–D and 43, those skilled in the art will recognize that the process of FIG. 38 results in a substantially planar sheet comprising photovoltaic cells positioned on a substrate having selected conductive and non-conductive regions. The cells are positioned such that a gap 160 is created between adjacent cells. Gap 160 extends at least partially over conductive regions W-2 and portions of non-conductive regions W-1, W-2. Holes extend from the top surface 98 to the bottom surface 100 at least in the region comprising conductive material 96.

Figure 44:
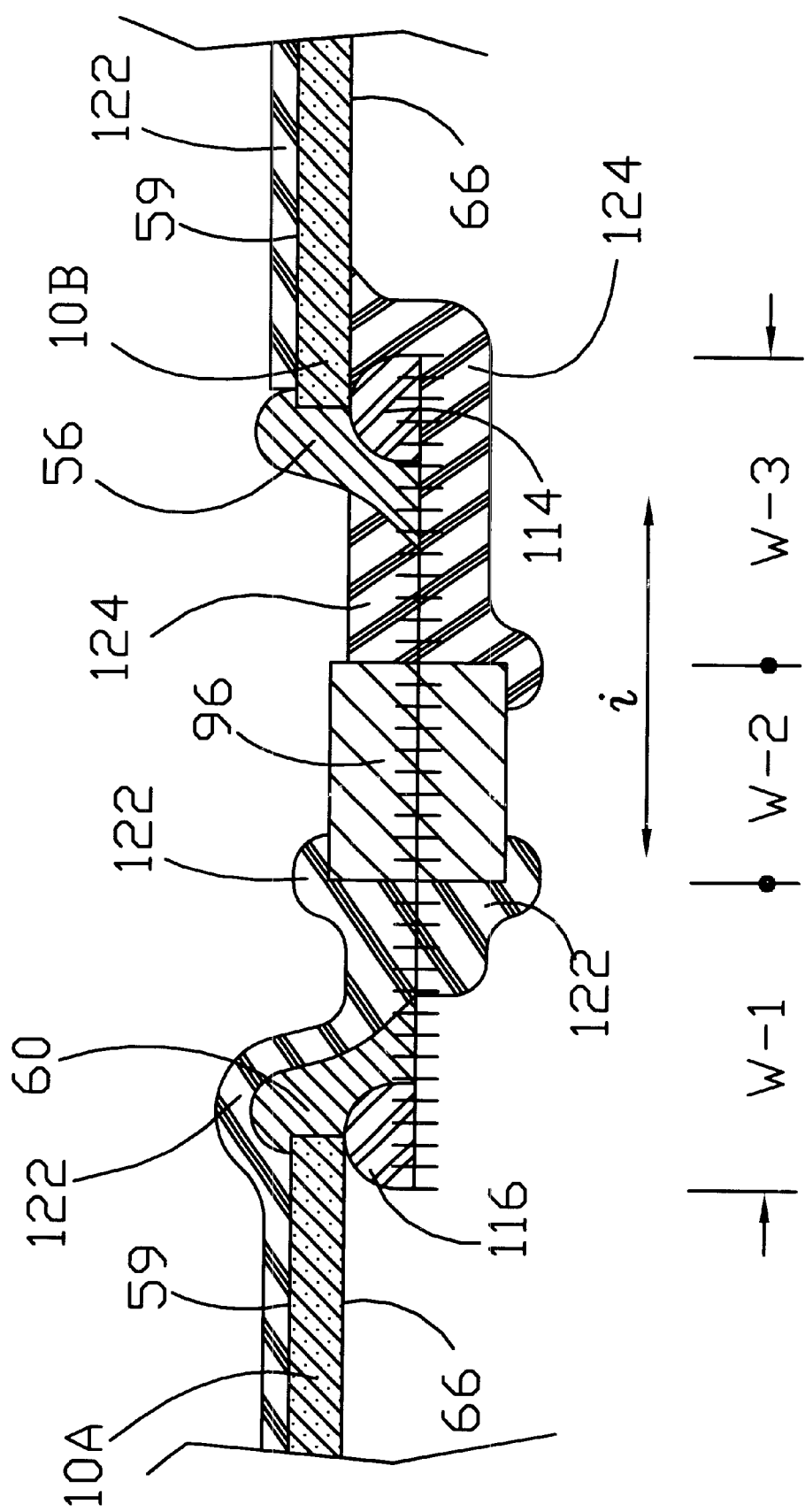
FIG. 44 is a view similar to FIG. 43 after a further processing step.

FIG. 44 is a view similar to FIG. 43 but following an additional manufacturing step in preparation of the series connected array. In FIG. 44 an electrically conductive coating 122 extends from the top surface 59 of photovoltaic cell 10a over insulating bead 60 and to electrically conductive region "W2". Coating 122 can comprise a number of electrically conductive media, such as conductive inks. Appropriate conductive inks can be applied by silk screening, printing, or simple masked printing. Alternate forms of applying coating 122 are chemical or vacuum deposition of conductive materials in conjunction with appropriate masking techniques.

As indicated in FIG. 44, conductive coating 122 extends outward across the surface of cell 10 in the form of a grid finger. These grid fingers obviously do not cover the entire top surface 59 of cell 10, but are positioned in spaced relationship on the surface as illustrated previously in FIG. 20.

FIG. 44 also shows an electrically conductive coating 124 extending from the second lower surface 66 of cell 10b and to electrically conductive region "W2". Coating 124 need not be the same composition nor applied by the same process as coating 122.

Figure 45:
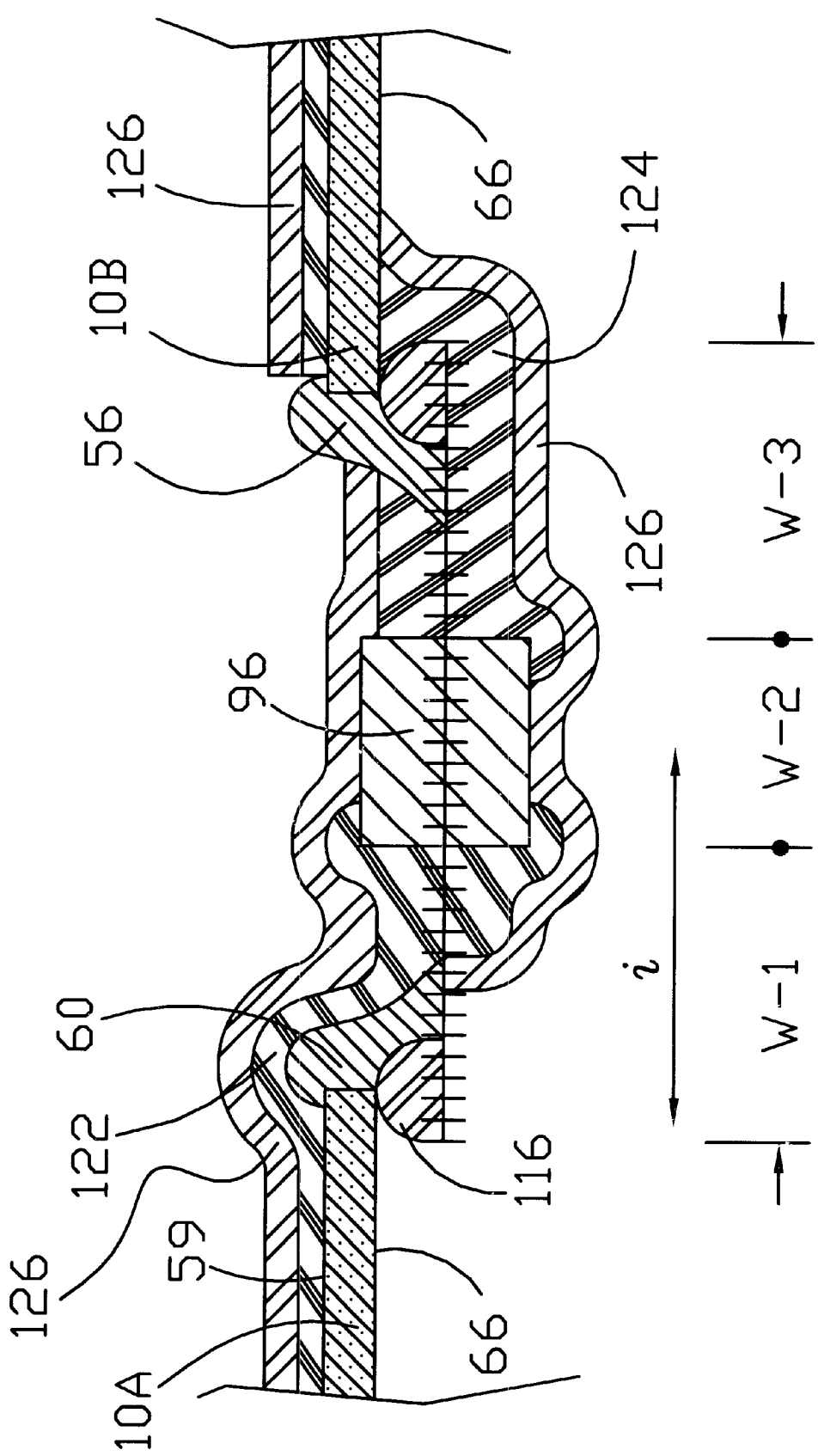
FIG. 45 is a view similar to FIG. 44 after a further processing step.

As shown in FIG. 44, electrical communication is established between the top surface 59 of photovoltaic cell 10a and the bottom surface 66 of adjacent photovoltaic cell 10b. However, most often the coatings 122 and 124 do not show optimal conductivity, either because coating resistivities are high relative to metals or coating thickness' are small. Therefore, FIG. 45 shows the possibility of reducing resistive power losses by applying an additional coating of pure metal. This additional coating 126 is preferably applied by electrodeposition, although chemical and vapor deposition can be employed. Thus, the use of DER in coating forms would serve as an excellent choice for coatings 122 and 124. The fact that second surface 100 of conductive region "W2" remains exposed in this embodiment allows for simple electrical contact for electroplating, a situation analogous to having conductive region surface 28 exposed as pointed out in prior embodiments. Obviously in all cases appropriate masking techniques, well know in the art, would be employed to prevent deposition on top surface 59 in those areas not covered with grid fingers. In the case of this final deposition of highly conductive metal, the through-hole conductivity characteristic of the substrate allows for a continuous highly conductive path from top surface 59 of one cell to bottom surface 66 of an adjacent cell. As with the embodiments of FIGS. 5, 20 and 21, the net current flow among cells in the embodiments of FIGS. 44 and 45 will be understood by those skilled in the art to be in the direction of the arrow labeled "i" in FIGS. 44 and 45.

Figure 49:
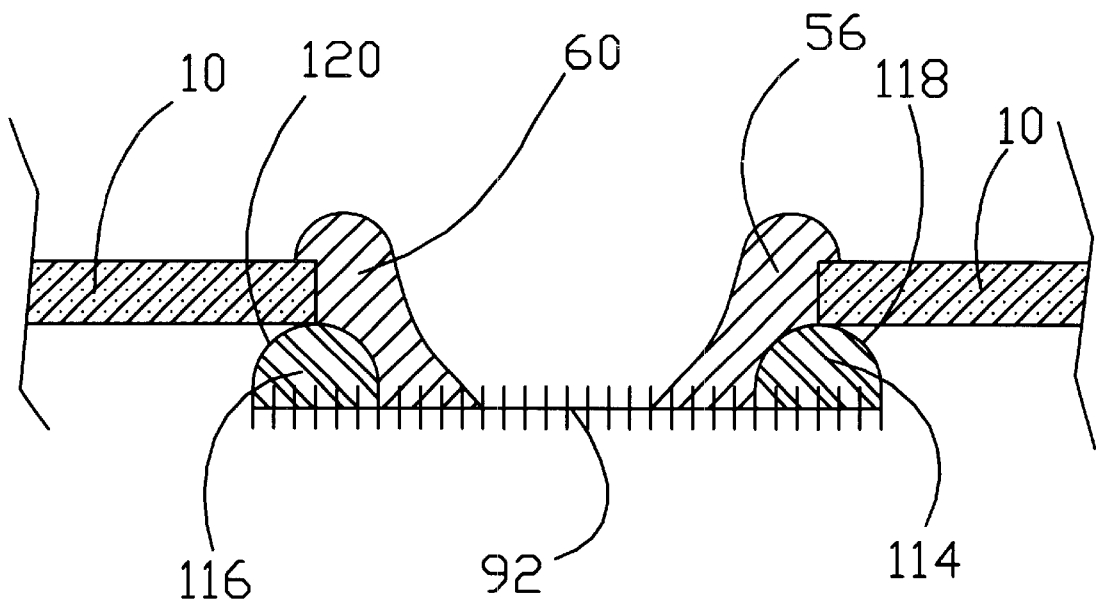
FIG. 49 is a view similar to FIG. 43, illustrating a different processing path.

FIG. 49 is a sectional view similar to FIG. 43 of an alternative intermediate article resulting from feeding the material of FIGS. 27 through 31 to the process of FIGS. 38 through 40 rather than the joining strips 104 of FIGS. 36 and 37. Here the conductive coating 96 defining region "W2" of FIGS. 36 and 37 has not been applied. However, applying the conductive coating 96 to the FIG. 49 structure at the time of applying conductive coatings 122 and 124 (see discussion of FIG. 44), results in converting the FIG. 49 structure into one equivalent to that shown in FIG. 44.

Figure 46:
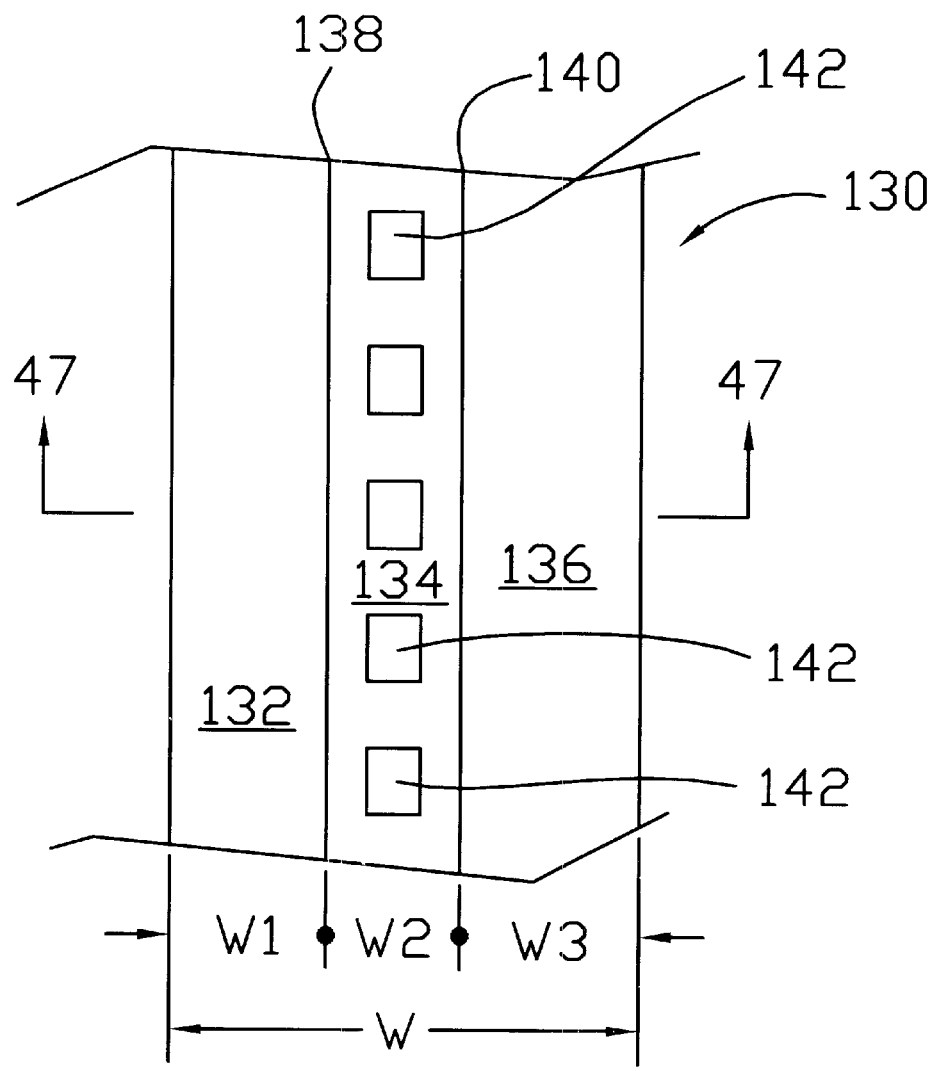
FIG. 46 is a top plan view of another embodiment of the novel substrate structures useful in the manufacture of series interconnected photovoltaic arrays.

FIG. 46 shows yet another embodiment of the current disclosure. The plan view of 46 illustrates a polymer based sheet 130 of width "W" subdivided into three areas "W1", "W2", and "W3" in fashion similar to that of FIG. 32. Polymer based sheet 130 can be conveniently formed by coextrusion of materials 132, 134, and 136, corresponding to regions "W1", "W2", and "W3" respectively. Materials 132, 134, and 136 can be all based on the same polymer or different polymers can be chosen. It is important however that proper joining integrity be established at mating interfaces 138 and 140.

The material 134 chosen for region "W2" is an electrically conductive polymer and may be a woven or non-woven fabric of electrically conductive polymer. In addition, it may be advantageous to electroplate the fabric, in which case a fabric comprising DER would be a preferred choice.

Figure 47:
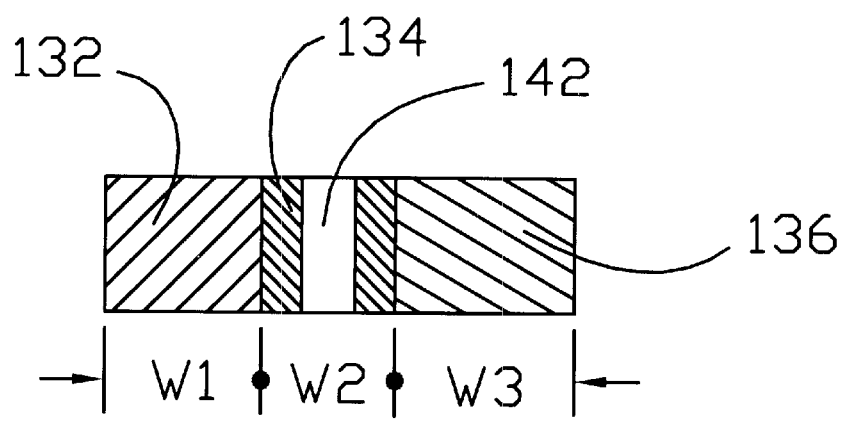
FIG. 47 is a sectional view taken substantially along line 47—47 of FIG. 46.

FIG. 47 is a sectional view taken substantially along line 47—47 of FIG. 46. As shown in FIGS. 46 and 47, region "W2" is caused to have holes 142 along its length. In the simplest conceptual case, these holes are simply punched in the region "W2". Another approach would be to formulate the region "W2" of FIGS. 46 and 47 from a fabric (nonwoven or woven) of electrically conductive polymer.

Figure 48:
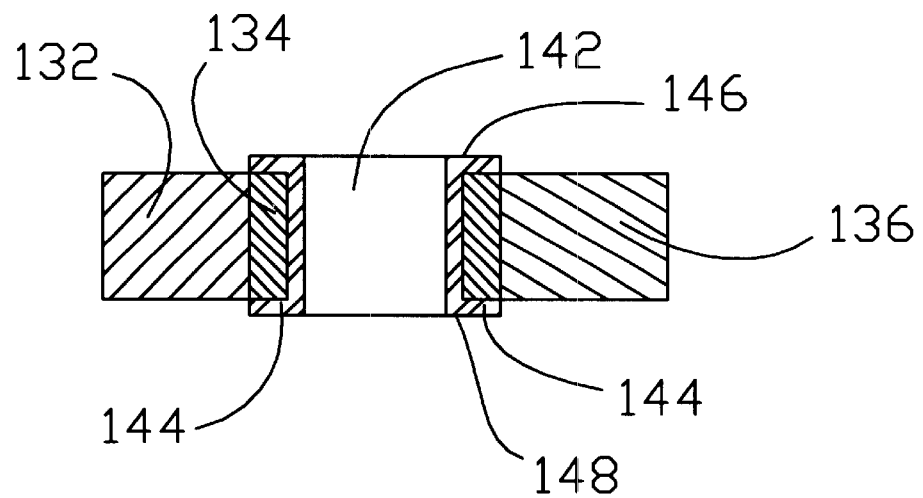
FIG. 48 is a view similar to FIG. 47 following an additional processing step.

FIG. 48 shows the structure of FIG. 47 following an additional processing step of depositing metal 144 through holes 142 to establish high electrical conductivity from top surface 146 to bottom surface 148. Preferably this metal deposition is by electroplating although chemical and vapor deposition techniques could be used.

In many respects the structures shown in FIGS. 47 and 48 resemble the structures depicted in FIGS. 37a and 37b respectively. Thus the use of the structures of FIGS. 47 and 48 in the process of FIGS. 38 through 40 would give results similar to those previously taught as one skilled in the art will recognize.

It is important to point out that many of the unique substrate and collector grid structures taught in the foregoing text are in fact selectively electroplated articles made possible by joining directly electroplateable resins (DER's) with other non-conductive materials in a multi-component article. This selectivity of DER's can by employed for significant advantages in both functional and decorative applications. For example, combining DER with a thermoplastic elastomer in a two shot molding is contemplated to combine a bright metal appearance with a soft grip for items such as knobs and handles.

Figure 50:
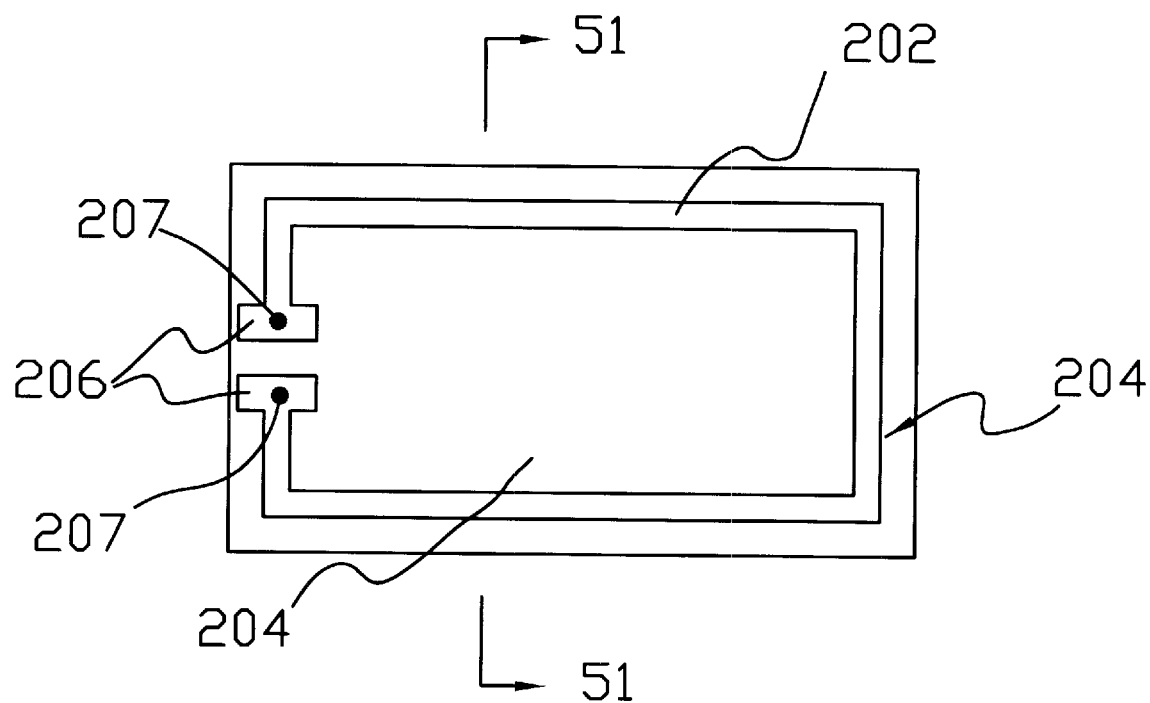
FIG. 50 is a plan view of an additional electrical circuit application made possible with directly electroplateable resins.
Figure 51:
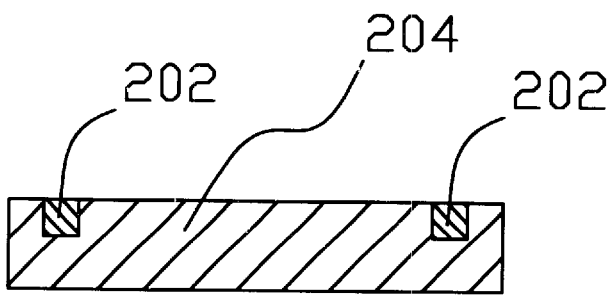
FIG. 51 is a sectional view taken substantially along the line 51—51 of FIG. 50.
Figure 52:
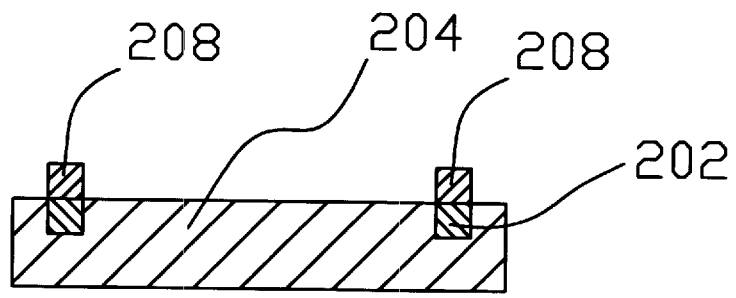
FIG. 52 is a view similar to 51 of the article of FIGS. 50 and 51 after an additional processing step.

Another functional application using the selectivity of DER is illustrated in FIGS. 50 and 51. FIGS. 50 and 51 show a DER material 202 fabricated in a loop design into the surface of a flat non-conductive substrate 204. Additionally a mounting pad 206 is incorporated into the DER portion of the two material article further incorporating wells 207. Subjecting the article illustrated in FIGS. 50 and 51 to an electroplating step results in the article illustrated in FIG. 52. In FIG. 52, electrodeposit 208 is deposited selectively on the surface of DER material 202, leaving the surface of 204 electrically insulating. It is also understood that wells 207 and pads 206 will also cover with electrodeposit. The electrodeposit coating the surface of wells 207 allows excellent ohmic contact to the connector pins of a microchip, while the electrodeposit on the loop structure gives a robust and highly conductive antenna for transformer power transmission. These features are highly desirable in the production of "smart cards" (or chip cards) used for convenient transportable information storage.

Figure 53:
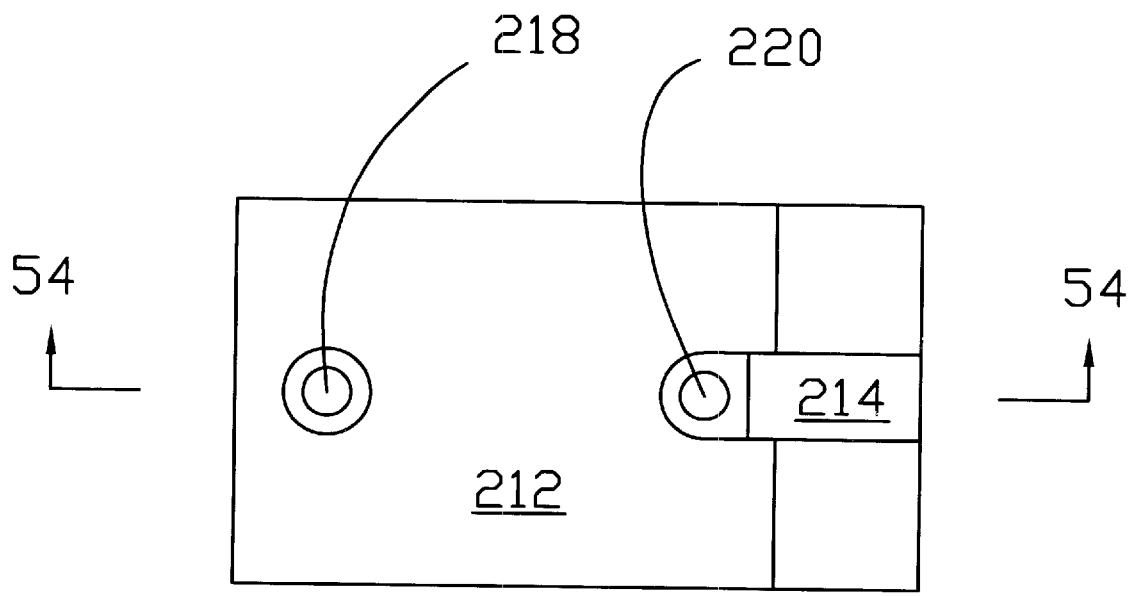
FIG. 53 is a plan view of an additional three dimensional electrical circuitry application made possible with directly electroplateable resins.
Figure 54:
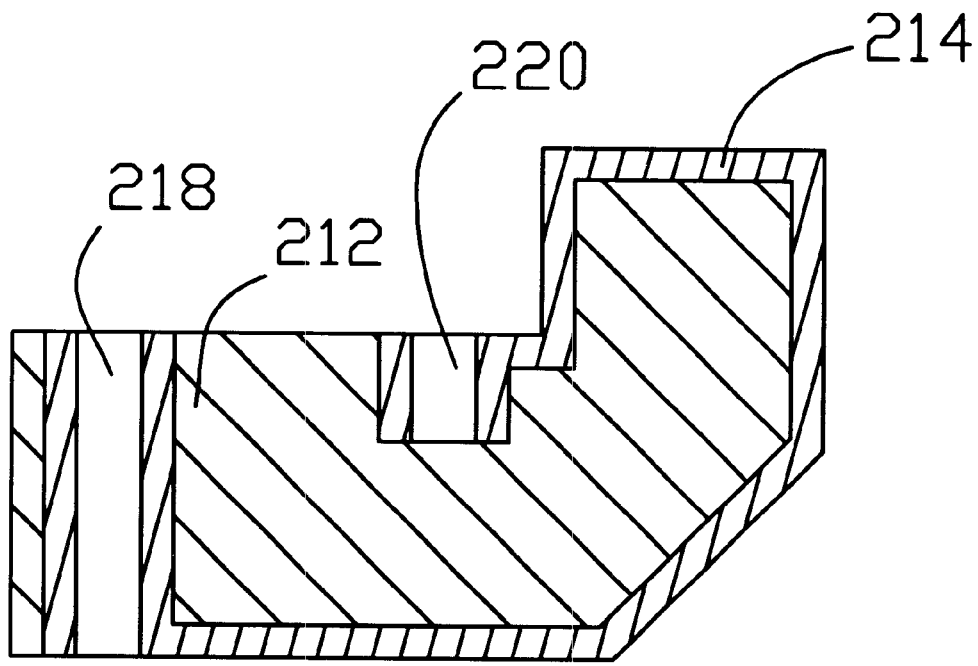
FIG. 54 is a sectional view taken substantially along the line 54—54 of FIG. 53.
Figure 55:
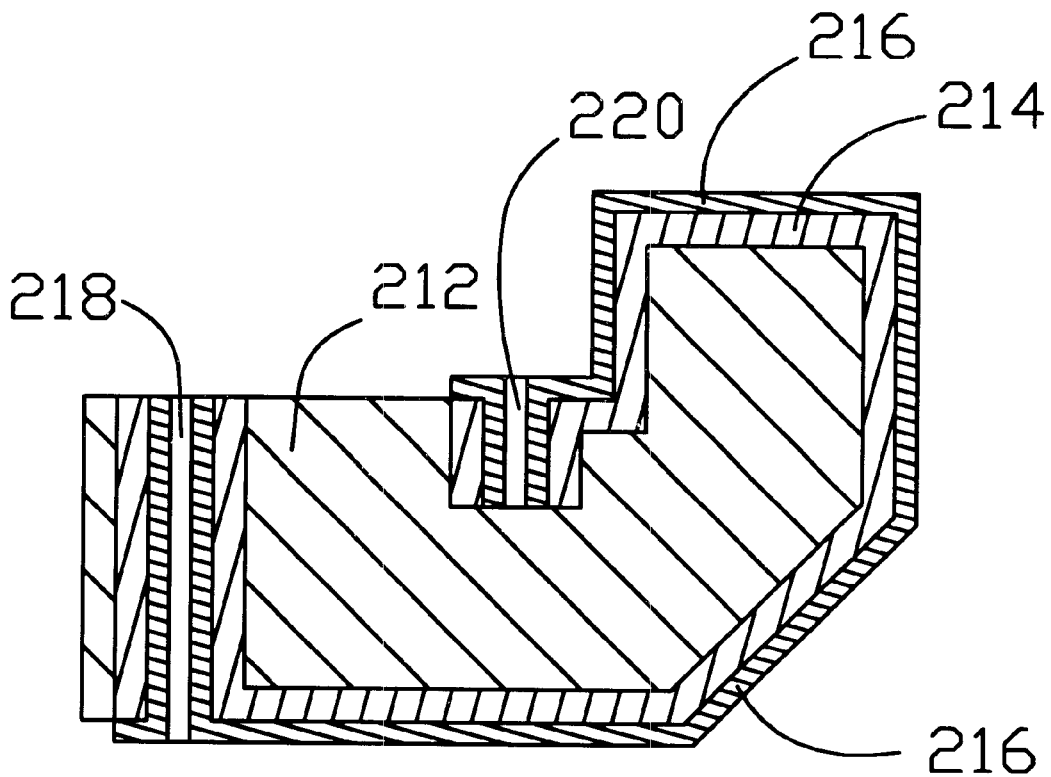
FIG. 55 is a sectional view of the article of FIGS. 53 and 54 following an additional processing step.

An additional application for the electrodeposition selectivity of DER materials is illustrated in FIGS. 53 through 55. These Figures illustrate a multicomponent article using DER to produce a conductive trace of a geometrically complex three-dimensional molding. In FIGS. 53 through 55, DER material is identified as numeral 214, and non-conductive material as 212. It is contemplated that the article illustrated in FIGS. 53 and 54 is produced by a multi-component (generally referred to as a multi color) molding process. FIGS. 53 and 54 also illustrate a well 220 and through-hole 218 which are molded into the object. FIG. 55 illustrates the article following exposure to an electroplating process. In FIG. 55, numeral 216 illustrates an electrodeposit. Electrodeposit 216 is understood to be either a single layer or multiple layers of metal as is understood in the electroplating art. The electrodeposit supplies a robust highly conductive circuit in a pattern difficult to achieve by alternate conventional techniques.

It is important to recognize that many known or useful circuits could be manufactured using the teachings described above. These include but are not limited to, many circuit boards, capacitors, induction heaters, connectors, switches, resistors, inductors, batteries, fuel cells, coils, signal lines, power lines, radiation reflectors, and sensors.

It is important to recognize that the unique design and process taught by the present disclosure is accomplished in a substantially fully additive fashion. No wasteful and costly material removal steps are needed to achieve the integrated series connected modules or arrays and electrical circuitry taught. This is a significant advantage over the prior art.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. In combination, multiple series connected photovoltaic cells and a substrate structure, said photovoltaic cells including a supporting electrically conductive cell foil having a top surface and a bottom surface separated by a thickness, said photovoltaic cells further comprising semiconductor material positioned on at least a portion of said top foil surface, said cell foil having a foil length and foil width, the extent of said foil width specifying a linear dimension whose endpoints define first and second terminal edges of said cells, said substrate structure comprising one or more conductive substrate regions having an electrically conductive top surface, said conductive top surface having a conductive top surface width dimension defined as being in the direction of net current flow between series connected cells, the endpoints of said conductive top surface width dimension defining first and second terminal edges of said conductive top surface, said substrate further comprising one or more insulating regions having a nonconductive top surface, said combination characterized by having said bottom surface of said cell foil of a first of said cells attached to said conductive top surface of a first of said conductive regions and having said bottom surface of said cell foil of a second of said cells being attached to said non-conductive surface of a first of said insulating substrate regions, said combination further characterized by having cell positioning of said cells on said substrate such that a line drawn in said conductive top surface width direction between said terminal edges of any selected of said conductive top surfaces extends across a said cell terminal edge of at most a single cell.

2. The combination of claim 1 wherein said electrically conductive cell foil is metal-based.

3. The combination of claim 1 wherein said electrically conductive cell foil thickness is between 0.001 cm. and 0.025 cm.

4. The combination of claim 1 wherein said cell foil is substantially devoid of holes extending through said cell foil thickness.

5. The combination of claim 1 wherein said photovoltaic cells and said substrate structure are initially separate and distinct.

6. In combination, multiple photovoltaic cells and a substrate structure, said photovoltaic cells comprising semiconductor material positioned on at least a portion of the top surface of a supporting electrically conductive cell foil, said cell foil having a bottom surface oppositely disposed to said top surface and separated from said top surface by a thickness, said substrate structure comprising one or more electrically conductive substrate regions, said one or more electrically conductive substrate regions comprising conductive substrate material extending over a selected material length and a material width, said material width defined as being in the direction of net current flow between series connected cells in a final array, the full extent of said conductive material width defining first and second terminal edges of said conductive substrate region, said substrate further comprising an electrically non-conductive substrate region positioned vicinal a said terminal edge of a first of said conductive substrate regions, said combination characterized by having at least a portion of said cell foil bottom surface of a first cell attached to said conductive region and having a least a portion of said bottom cell foil surface of a second cell attached to said non-conductive substrate region said cells being initially separate and distinct from said substrate structure.

7. The combination of claim 6 wherein said electrically conductive cell foil is metal-based.

8. The combination of claim 6 wherein said electrically conductive cell foil is substantially devoid of holes extending through said cell foil thickness.

9. The combination of claim 6 wherein said cell foil thickness is between 0.001 cm. and 0.025 cm.

10. In combination, multiple photovoltaic cells and a substrate structure, said photovoltaic cells comprising semiconductor material positioned on at least a portion of the top surface of a supporting electrically conductive cell foil said supporting cell foil and having a bottom surface oppositely disposed to said top surface and separated from said top surface by a thickness, said supporting cell foil having a foil length and foil width, the full extent of said foil width specifying a linear dimension whose endpoints define first and second cell foil terminal edges, said substrate structure comprising one or more electrically conductive substrate regions, said one or more electrically conductive substrate regions comprising conductive substrate material extending over a selected material length and a material width, said material width defined as being in the direction of net current flow between series connected cells in a final array, the full extent of said conductive material width defining first and second terminal edges of said conductive substrate region, said substrate further comprising an electrically non-conductive substrate region joined to a first of said conductive substrate regions, said combination characterized by having at least a portion of said bottom surface of said supporting cell foil of a first of said cells attached to said first of said conductive substrate regions and having at least a portion of said bottom surface of said supporting cell foil of a second of said cells being attached to said non-conductive substrate region, said combination further characterized by having cell positioning of said cells on said substrate such that a line drawn in said material width direction between said terminal edges of any selected of said conductive substrate regions crosses a said cell foil terminal edge of at most a single cell.

11. The combination of claim 10 wherein said foil is metal-based.

12. The combination of claim 10 wherein said cell foil thickness is between 0.001 cm. and 0.025 cm.

13. The combination of claim 10 wherein said supporting cell foil is substantially devoid of holes extending through said foil thickness.

14. The combination of claim 10 wherein said photovoltaic cells are initially separate and distinct from said substrate structure.

15. The combination of claim 10 wherein a selected one of said conductive substrate regions has top and bottom conductive substrate region surfaces, at least a portion of said top conductive region surface being conductive, said cell foil of said first of said cells being positioned over at least a portion of said top conductive region surface, said combination further characterized by having at least a portion of said bottom conductive region surface being conductive, there being electrical communication between said conductive portions of said top and bottom conductive region surfaces, said conductive portion of said bottom conductive region surface area being at least partially exposed.

16. The combination of claim 15 wherein said selected conductive substrate region includes non-conductive material.

17. The combination of claim 10 wherein electrical joining is achieved between said cell foil of said first of said cells and said conductive substrate region, said electrical joining extending in the direction of said cell foil length.

18. In combination, multiple photovoltaic cells and a substrate structure, said photovoltaic cells comprising semiconductor material positioned on at least a portion of a top surface of a supporting cell foil, said supporting foil being metal-based and having a bottom surface separated from said top surface by a thickness, said cell metal-based foil having a foil length, a foil width, and a foil thickness, the full extent of said foil width specifying a linear dimension whose endpoints define first and second cell foil terminal edges, said cell metal-based foil thickness being between 0.001 cm. and 0.025 cm., said substrate structure comprising one or more electrically conductive substrate surfaces, a first of said one or more electrically conductive substrate surfaces extending over a conductive surface width defined as being in the direction of net current flow between series connected cells in a final array, the full extent of said electrically conductive surface width defining first and second terminal edges of said electrically conductive surface, said substrate further comprising at least one electrically non-conductive substrate surface, said combination characterized by having said bottom surface of said foil of a first of said cells attached to a first of said electrically conductive substrate surfaces, said combination further characterized by having cell positioning of said cells on said substrate such that a line drawn in said conductive surface width direction between said terminal edges of any selected said first of said conductive substrate surfaces extends across a said cell terminal edge of at most a single cell.

19. The combination of claim 18 wherein said support structure is substantially devoid of holes extending through said support structure thickness.

20. The combination of claim 18 further characterized by said photovoltaic cells being initially distinct and separate from said substrate structure.

21. In combination, two or more photovoltaic cells and a substrate structure for facilitating interconnections among two or more of said cells, said combination characterized by having, each of said cells comprising semiconductor material and a transparent electrode positioned on a supporting structure comprising a metal-based foil and having top and bottom support structure surfaces, said support structure being substantially devoid of holes extending through said support structure from said top to said bottom support structure surfaces, and said substrate structure comprising one or more units, each of said units comprising contiguous electrically conductive and electrically insulating regions, said electrically conductive region being distinct from said transparent electrode, said electrically conductive region having top and bottom conductive region surfaces, said combination characterized in that said supporting structure of a first of said cells is positioned to overlay at least a portion of said conductive region of a first of said units and electrical joining is achieved between said supporting structure lower surface of said first of said cells and said electrically conductive region of said first of said units, said combination further characterized by having said supporting structure of a second of said cells joined to said insulating region of said first of said units.

22. The combination of claim 21 wherein said bottom conductive region surface of said first of said units is at least partially exposed.

23. The combination of claim 21 wherein said substrate structure is flexible.

24. The combination of claim 21 further characterized by said cells being initially distinct and separate from said substrate.

25. The combination of claim 21 wherein said metal-based foil has a thickness between 0.001 cm. and 0.025 cm.

26. In combination, multiple photovoltaic cells and a substrate structure, said photovoltaic cells comprising a supporting structure having top and bottom supporting structure surfaces separated by a supporting structure thickness, each of said cells further comprising semiconductor material positioned on at least a portion of said top supporting structure surface, said supporting structure comprising metal-based foil having a length and a width, the full extent of said foil width defining first and second terminal width edges of said metal-based foil, said combination characterized by having two or more of said cells placed on said substrate positioned such that a said first terminal width edge of said foil of a first of said cells is separated from said second terminal width edge of said foil of an adjacent second of said cells leaving a gap therebetween, said combination further characterized by having holes extending from said top to said bottom substrate surfaces positioned within said gap.

27. The combination of claim 26 further characterized by having conductive material within a portion of said holes.

28. The combination of claim 26 further characterized by the absence of holes extending through said supporting structure thickness.

29. The combination of claim 26 further characterized by said cells being initially distinct and separate from said substrate structure.

* * * * *